United States Patent
Zeng et al.

(10) Patent No.: US 12,069,891 B2
(45) Date of Patent: Aug. 20, 2024

(54) DISPLAY SUBSTRATE AND MANUFACTURING METHOD THEREOF, AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cheng Zeng, Beijing (CN); Jaeho Lee, Beijing (CN); Myoungsoo Lee, Beijing (CN); Xuemei Cui, Beijing (CN); Ruitao Li, Beijing (CN); Shiqi Li, Beijing (CN); Zhen Sun, Beijing (CN); Lulin Ma, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 409 days.

(21) Appl. No.: 17/626,708

(22) PCT Filed: Nov. 24, 2020

(86) PCT No.: PCT/CN2020/130980
§ 371 (c)(1),
(2) Date: Jan. 12, 2022

(87) PCT Pub. No.: WO2022/109763
PCT Pub. Date: Jun. 2, 2022

(65) Prior Publication Data
US 2023/0067641 A1 Mar. 2, 2023

(51) Int. Cl.
*H10K 50/858* (2023.01)
*H10K 50/844* (2023.01)
(Continued)

(52) U.S. Cl.
CPC ....... *H10K 50/858* (2023.02); *H10K 50/8445* (2023.02); *H10K 71/00* (2023.02); *H10K 2102/00* (2023.02); *H10K 2102/351* (2023.02)

(58) Field of Classification Search
CPC .. H10K 50/858; H10K 50/8445; H10K 71/00; H10K 2102/351; H10K 2102/00
See application file for complete search history.

(56) References Cited

U.S. PATENT DOCUMENTS

2009/0141230 A1* 6/2009 Inoue ................ C04B 41/52
349/158

OTHER PUBLICATIONS

Tsuchimoto et al., CN 101427158, May 2009 (Year: 2009).*
(Continued)

*Primary Examiner* — Mary Ellen Bowman
(74) *Attorney, Agent, or Firm* — IP & T GROUP LLP

(57) ABSTRACT

A display substrate includes a backplane, first light-emitting devices capable of emitting first color light, second light-emitting devices capable of emitting second color light that are all disposed on the backplane, a low-refractive-index intercalation layer disposed at a side, away from the backplane, of the first light-emitting devices and the second light-emitting devices, and an encapsulation layer. The encapsulation layer includes a first inorganic barrier layer, a first organic barrier layer and a second inorganic barrier layer that are sequentially stacked on a side of the low-refractive-index intercalation layer away from the backplane. A refractive index of the low-refractive-index intercalation layer is less than a refractive index of the first inorganic barrier layer. In a direction perpendicular to the backplane, a transmittance of the low-refractive-index intercalation layer to the first color light is less than a transmittance of the low-refractive-index intercalation layer to the second color light.

20 Claims, 21 Drawing Sheets

(51) Int. Cl.
   *H10K 71/00*   (2023.01)
   *H10K 102/00*  (2023.01)

(56) References Cited

OTHER PUBLICATIONS

Jeong et al., CN 102074568, May 2011 (Year: 2011).*
Matsuda et al., CN 102598865, Jul. 2012 (Year: 2012).*
Gu et al., CN 107565055, Jan. 2018 (Year: 2018).*
Yoshida, WO 2007032526, Mar. 2007 (Year: 2007).*

* cited by examiner

DISPLAY SUBSTRATE AND
MANUFACTURING METHOD THEREOF,
AND DISPLAY APPARATUS

CROSS-REFERENCE TO RELATED
APPLICATION

This application is a national phase entry under 35 USC 371 of International Patent Application No. PCT/CN2020/130980 filed on Nov. 24, 2020, which is incorporated herein by reference in its entirety.

TECHNICAL FIELD

The present disclosure relates to the field of display technologies, and in particular, to a display substrate and a manufacturing method thereof, and a display apparatus.

BACKGROUND

Organic light-emitting diode (OLED) display apparatuses have become one of the mainstream development directions in the field of display technology due to their characteristics of self-luminescence, wide viewing angle, wide color gamut, high contrast, lightness and thinness, foldability, bendability, portability, and the like.

At different viewing angles, a color shift phenomenon occurs in an image displayed by a display apparatus, especially in a case of a large viewing angle, e.g., a viewing angle greater than or equal to 60°, the color shift phenomenon of the image is more serious.

SUMMARY

In one aspect, a display substrate is provided. The display substrate includes a backplane, first light-emitting devices capable of emitting first color light and second light-emitting devices capable of emitting second color light that are disposed on the backplane, a low-refractive-index intercalation layer disposed at a side, away from the backplane, of the first light-emitting devices and the second light-emitting devices, and an encapsulation layer. The encapsulation layer includes a first inorganic barrier layer, a first organic barrier layer and a second inorganic barrier layer that are sequentially stacked on a side of the low-refractive-index intercalation layer away from the backplane.

A refractive index of the low-refractive-index intercalation layer is less than a refractive index of the first inorganic barrier layer. In a direction perpendicular to the backplane, a transmittance of the low-refractive-index intercalation layer to the first color light is less than a transmittance of the low-refractive-index intercalation layer to the second color light.

In some embodiments, the display substrate further includes third light-emitting devices capable of emitting third color light disposed on the backplane. In the direction perpendicular to the backplane, the transmittance of the low-refractive-index intercalation layer to the first color light is less than a transmittance of the low-refractive-index intercalation layer to the third color light.

In some embodiments, the refractive index of the low-refractive-index intercalation layer is in a range from 1.45 to 1.73, inclusive. A thickness of the low-refractive-index intercalation layer is in a range from 0.03 μm to 0.10 μm, inclusive.

In some embodiments, a material of the low-refractive-index intercalation layer includes silicon oxide and silicon oxynitride, and a ratio of the silicon oxide to the silicon oxynitride is in a range from 0.001 to 0.1, inclusive.

In some embodiments, a sum of a thickness of the first inorganic barrier layer and a thickness of the low-refractive-index intercalation layer is less than or equal to 1.1 μm.

In some embodiments, a thickness of the low-refractive-index intercalation layer is less than a thickness of the first inorganic barrier layer.

In some embodiments, a thickness of the low-refractive-index intercalation layer is in a range from 0.03 μm to 0.10 μm, inclusive. A thickness of the first inorganic barrier layer is in a range from 1.0 μm to 1.07 μm, inclusive.

In some embodiments, the display substrate further includes a light extraction layer disposed at the side, away from the backplane, of the first light-emitting devices and the second light-emitting devices, and the light extraction layer is located on a side of the low-refractive-index intercalation layer proximate to the backplane. A refractive index of the light extraction layer is greater than the refractive index of the low-refractive-index intercalation layer.

In some embodiments, the refractive index of the low-refractive-index intercalation layer is in a range from 1.45 to 1.63, inclusive. The refractive index of the light extraction layer is in a range from 1.8 to 2.0, inclusive.

In some embodiments, the display substrate has a plurality of sub-pixel areas, and each sub-pixel area is provided with a light-emitting device of the first light-emitting devices and the second light-emitting devices therein. The light-emitting device includes a cathode layer, and the low-refractive-index intercalation layer is in direct contact with the cathode layer.

In some embodiments, the refractive index of the low-refractive-index intercalation layer is in a range from 1.47 to 1.73, inclusive. A thickness of the low-refractive-index intercalation layer is in a range from 0.05 μm to 0.10 μm, inclusive.

In some embodiments, the encapsulation layer further includes a second organic barrier layer and a third inorganic barrier layer that are sequentially stacked on a side of the second inorganic barrier layer away from the backplane.

In some embodiments, the refractive index of the first inorganic barrier layer is in a range from 1.75 to 1.85, inclusive.

In some embodiments, the first color light is blue light, the second color light is one of red light and green light, and the third color light is another of red light and green light.

In some embodiments, the first color light is green light, the second color light is one of red light and blue light, and the third color light is another of red light and blue light.

In another aspect, a display apparatus is provided, which includes the display substrate as described in any one of the above embodiments.

In yet another aspect, a manufacturing method of a display substrate is provided, which includes:
  manufacturing a backplane;
  forming first light-emitting devices capable of emitting first color light and second light-emitting devices capable of emitting second color light on the backplane;
  forming a low-refractive-index intercalation layer at a side, away from the backplane, of the first light-emitting devices and the second light-emitting devices; and
  forming an encapsulation layer on a side of the low-refractive-index intercalation layer away from the backplane, the encapsulation layer including a first inorganic barrier layer, a first organic barrier layer and a second inorganic barrier layer that are sequentially stacked on a side of the low-refractive-index intercalation layer away from the backplane.

A refractive index of the low-refractive-index intercalation layer is less than a refractive index of the first inorganic barrier layer. In a direction perpendicular to the backplane, a transmittance of the low-refractive-index intercalation layer to the first color light is less than a transmittance of the low-refractive-index intercalation layer to the second color light.

In some embodiments, the low-refractive-index intercalation layer is formed at the side, away from the backplane, of the first light-emitting devices and the second light-emitting devices by using a first film deposition process. The first inorganic barrier layer is formed on the side of the low-refractive-index intercalation layer away from the backplane by using a second film deposition process.

In some embodiments, the manufacturing method further includes forming a light extraction layer on the side, away from the backplane, of the first light-emitting devices and the second light-emitting devices before forming the low-refractive-index intercalation layer.

In some embodiments, a ratio of a power of electrodes used in the second film deposition process to a power of electrodes used in the first film deposition process is in a range from 1.1 to 1.15, inclusive.

BRIEF DESCRIPTION OF THE DRAWINGS

In order to describe technical solutions in the present disclosure more clearly, the accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and actual timings of signals to which the embodiments of the present disclosure relate.

DETAILED DESCRIPTION

Figure 1:
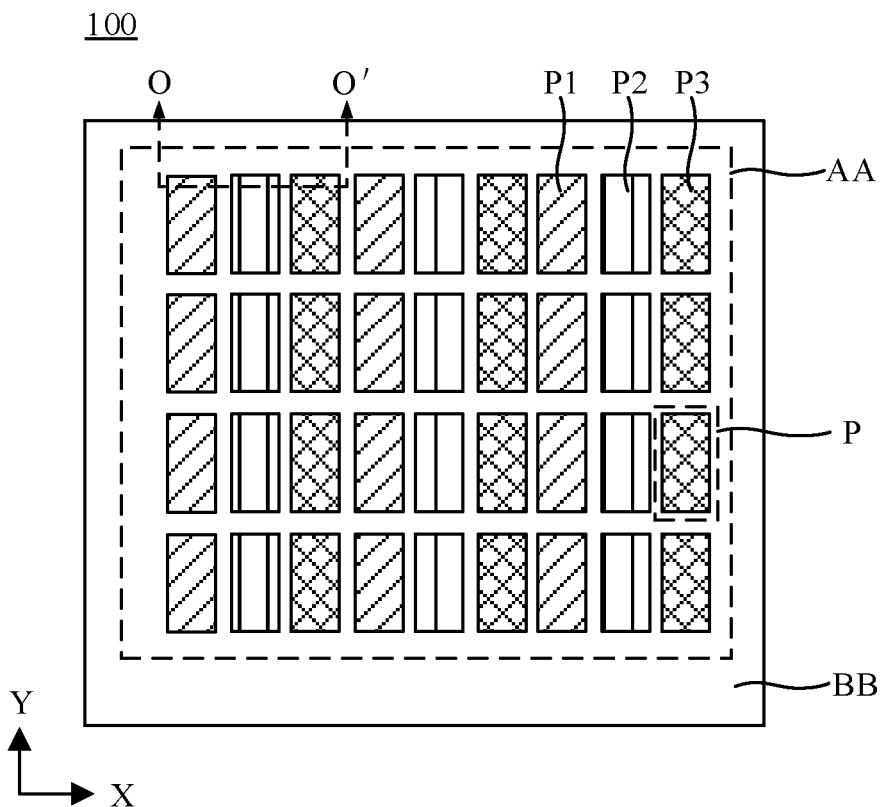
FIG. 1 is a top view of a display substrate, in accordance with some embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained on a basis of the embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as open and inclusive, i.e., "including, but not limited to." In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined by "first" and "second" may explicitly or implicitly include one or more of the features. In the description of the embodiments of the present disclosure, the term "a plurality of/the plurality of" means two or more unless otherwise specified.

In the description of some embodiments, the term "electrically connected" and its extensions may be used. For example, the term "electrically connected" may be used when describing some embodiments to indicate that two or more components are in direct physical contact or electrical contact with each other.

The phrase "A and/or B" includes the following three combinations: only A, only B, and a combination of A and B.

In addition, the use of the phrase "based on" is meant to be open and inclusive, since a process, step, calculation or other action that is "based on" one or more of the stated conditions or values may, in practice, be based on additional conditions or values exceeding those stated.

The term "approximately" as used herein includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to cross-sectional views and/or plan views as idealized exemplary drawings. In the accompanying drawings, thicknesses of layers and areas are enlarged for clarity. Therefore, variations in shape with respect to the drawings due to, for example, manufacturing technologies and/or tolerances may be envisaged. Therefore, the exemplary embodiments should not be construed as being limited to the shapes of the areas shown herein, but including shape deviations due to, for example, manufacturing. For example, an etched area shown in a rectangular shape generally has a curved feature. Therefore, the areas shown in the accompanying drawings are schematic in nature, and their shapes are not intended to show actual shapes of the area in a device, and are not intended to limit the scope of the exemplary embodiments.

Some embodiments of the present disclosure provide a display substrate. As shown in FIG. 1, the display substrate 100 has an active area AA (also referred to as an effective display area) and a peripheral area BB that is located on at least one side of the active area AA. The active area AA has a plurality of sub-pixel areas P, and each sub-pixel area P is provided with a sub-pixel therein.

For example, in a row direction X in which the plurality of sub-pixel areas P are arranged, every three adjacent sub-pixel areas P are provided with a red sub-pixel P1, a green sub-pixel P2 and a blue sub-pixel P3 therein. In a column direction Y in which the plurality of sub-pixel areas P are arranged, each column of sub-pixels has a same light-emitting color, and an arrangement of the sub-pixel areas P in embodiments of the present disclosure is not limited thereto.

Figure 2A:
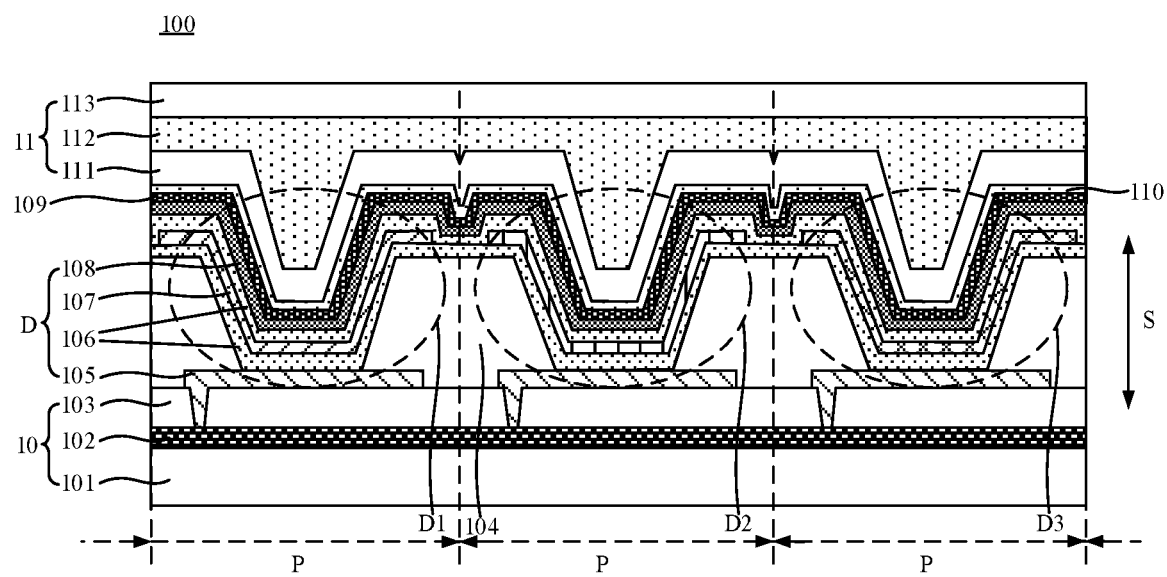
FIG. 2A is a partial cross-sectional view of the display substrate in FIG. 1 along the line O-O'.

As shown in FIG. 2A, the display substrate 100 includes a backplane 10, and first light-emitting devices D1 capable of emitting first color light and second light-emitting devices D2 capable of emitting second color light that are disposed on the backplane 10.

The backplane 10 includes a base 101, a pixel driving circuit layer 102 disposed on the base 101, and a planarization layer 103 covering the pixel driving circuit layer 102. The planarization layer 103 has via holes.

As shown in FIG. 2A, the display substrate 100 further includes a pixel defining layer 104 disposed at a side of the planarization layer 103 away from the base 101. The pixel defining layer 104 has a plurality of openings, and each sub-pixel area P corresponds to an opening of the pixel defining layer 104.

As shown in FIG. 2A, each sub-pixel area P is provided with a light-emitting device D therein, which includes an anode layer 105 and a light-emitting layer 107. The anode layer 105 of the light-emitting device D is electrically connected to the pixel driving circuit layer 102 through a via hole in the planarization layer 103. An opening of the pixel defining layer 104 exposes at least a portion of the anode layer 105. The light-emitting layer 107 is disposed at a side of the anode layer 105 away from the base 101, and at least a portion of the light-emitting layer 107 is located in the opening of the pixel defining layer 104. The display substrate 100 further includes a cathode layer 108 disposed at a side of the light-emitting layer 107 away from the backplane 10.

In some embodiments, as shown in FIG. 2A, every three adjacent sub-pixel areas P are provided with a first light-emitting device D1 and a second light-emitting device D2 therein. The first color light emitted by the first light-emitting device D1 is blue light. The first light-emitting device D1 is at least a portion of a blue sub-pixel, that is, the first light-emitting device D1 is located in a sub-pixel area P where the blue sub-pixel is located; the second color light emitted by the second light-emitting device D2 is one of red light and green light. The second light-emitting device D2 is at least a portion of a red sub-pixel or a green sub-pixel, that is, the second light-emitting device D2 is located in a sub-pixel area P where the red sub-pixel is located or in a sub-pixel area P where the green sub-pixel is located.

In some embodiments, as shown in FIG. 2A, the light-emitting device D further includes a common layer 106 located on a side of the light-emitting layer 107 proximate to the anode layer 105 and another common layer 106 located on a side of the light-emitting layer 107 proximate to the cathode layer 108. The common layer 106 between the light-emitting layer 107 and the anode layer 105 may include at least one of a hole transporting layer (HTL) and a hole injection layer (HIL). The common layer 106 between the light-emitting layer 107 and the cathode layer 108 may include at least one of an electron transporting layer (ETL) and an electron injection layer (EIL). The above layers in the common layers 106 are used to adjust the number of holes and electrons reaching the light-emitting layer 107, thereby adjusting optical characteristics of the light-emitting device D.

In the light-emitting device D of embodiments of the present disclosure, through the pixel driving circuit layer 102, a voltage is applied to the anode layer 105 and another voltage is applied to the cathode layer 108, so that a voltage difference is formed between the anode layer 105 and the cathode layer 108, the light-emitting layer 107 in the light-emitting device D is driven to emit light, and a display apparatus displays images.

As shown in FIG. 2A, the light-emitting device D has a microcavity structure, and the microcavity structure is at least formed of the anode layer 105, the light-emitting layer 107 and the cathode layer 108.

In some embodiments, as shown in FIG. 2A, a light-emitting mode of the light-emitting device D is top emission. In this case, the anode layer 105 is a total reflection electrode, serving as a reflective mirror structure, and the cathode layer 108 is a semi-transparent electrode, serving as a semi-transparent reflective mirror structure. Light emitted by the light-emitting layer 107 in the light-emitting device D is emitted in a direction away from the base 101 after being reflected multiple times between the anode layer 105 and the cathode layer 108 of the microcavity structure, i.e., between the reflective mirror structure and the semi-transparent reflective mirror structure of the microcavity structure, which may improve a light-emitting efficiency of the light-emitting device D in a direction S perpendicular to the backplane 10. This phenomenon is a microcavity effect.

In the related art, a color shift phenomenon may occur in an image displayed by an organic light-emitting diode (OLED) display apparatus at different viewing angles. For example, at a large viewing angle, the image displayed by the OLED display apparatus has a yellowing phenomenon.

A principle of color shift generated by the OLED display apparatus may be as follows.

A spectrum of the light emitted by the light-emitting layer 107 in the light-emitting device D before being reflected multiple times in the microcavity structure is referred to as an intrinsic spectrum, also referred to as a PL($\lambda$) spectrum; a spectrum of the light emitted by the light-emitting layer 107 in the light-emitting device D after being reflected the multiple times in the microcavity structure is referred to as an EL($\lambda$) spectrum. A relationship between the EL($\lambda$) spectrum and the PL($\lambda$) spectrum is shown in the following formula 1-1:

$$EL(\lambda) = PL(\lambda) \times Gcav.(\lambda) \qquad (1\text{-}1),$$

where Gcav.($\lambda$) is a microcavity gain spectrum.

A formula 1-2 listed below is a calculation formula of the microcavity gain spectrum Gcav.($\lambda$):

$$Gcav.(\lambda) = \left|\frac{\sum \tilde{\psi}_{cav.}}{2\tilde{\psi}_{Aol}}\right|^2 \frac{\tau_{cav.}}{\tau_{con.}} = \qquad (1\text{-}2)$$

-continued $$\frac{(1-R_2-A_2)\left[1+R_1+2R_1^{0.5}\cos\left(\frac{4\pi n x \cos\theta}{\lambda}+\varphi_{BM}\right)\right]}{4\left[1+R_1R_2-2(R_1R_2)^{0.5}\cos\left(\frac{4\pi n L \cos\theta}{\lambda}+\varphi_M\right)\right]} \frac{\tau_{cav.}}{\tau_{con.}},$$

where R1 is a reflectance of the reflective mirror structure; R2 is a reflectance of the semi-transparent reflective mirror structure; $\lambda$ is a wavelength of light; $\tilde{\psi}_{cav.}$ is an electric field intensity of light coupled out from the semi-transparent reflective mirror structure; $\tilde{\psi}_{Aol}$ is an electric field intensity of a luminous source in free space; $\tau_{cav.}$ is an excited state lifetime of molecules in the microcavity structure; $\tau_{con.}$ is an excited state lifetime of molecules in free space; $A_2$ is an absorptivity of the semi-transparent reflective mirror structure; n is a modal order of cavity resonance; x is a distance from the luminous source to the reflective mirror structure; L is a total cavity length; $\varphi_{BM}$ is a sum of reflection phase differences on the anode layer 105 and the cathode layer 108; and $\varphi_M$ is a phase difference on a reflective metal side (i.e., the reflectance of the reflective mirror structure).

According to formula 1-2, it will be seen that in a case where other parameters are unchanged, the larger the R1 and the R2 are, the larger the microcavity gain spectrum Gcav.($\lambda$) is, that is, the stronger the microcavity effect of the microcavity structure of the light-emitting device D is.

A formula 1-3 listed below is a calculation formula of a half-width (FWHM) of the EL($\lambda$) spectrum:

$$FWHM = \frac{\lambda^2}{2} \times \frac{1-\sqrt{R_1R_2}}{\pi(R_1R_2)^{1/4}}. \qquad (1\text{-}3)$$

According to formula 1-3, it will be seen that in a case where other parameters are unchanged, the larger the R1 and the R2 are, the smaller the half-width of the EL($\lambda$) spectrum is, that is, the narrower the half-width of the EL($\lambda$) spectrum is.

A value of $\lambda$ of a peak position of the microcavity gain spectrum Gcav.($\lambda$) is denoted by $\lambda_m$. A formula 1-4 listed below shows a relationship between the peak position $\lambda_m$ of the microcavity gain spectrum Gcav.($\lambda$) and a viewing angle $\theta$:

$$\lambda_m = \frac{4\pi n L \cos\theta}{\phi_m - 2\pi m}, \qquad (1\text{-}4)$$

where $\phi_m$ is a total phase shift caused by the reflective mirror structure and the semi-transparent reflective mirror structure; and m is a mode order of a resonant cavity (in general, m=0).

According to formula 1-4, it will be seen that as the viewing angle $\theta$ increases, a value of $\lambda_m$ decreases, that is, the peak position of the microcavity gain spectrum Gcav.($\lambda$) is blue-shifted (shifted towards a direction of decreasing wavelength).

Figure 3A:
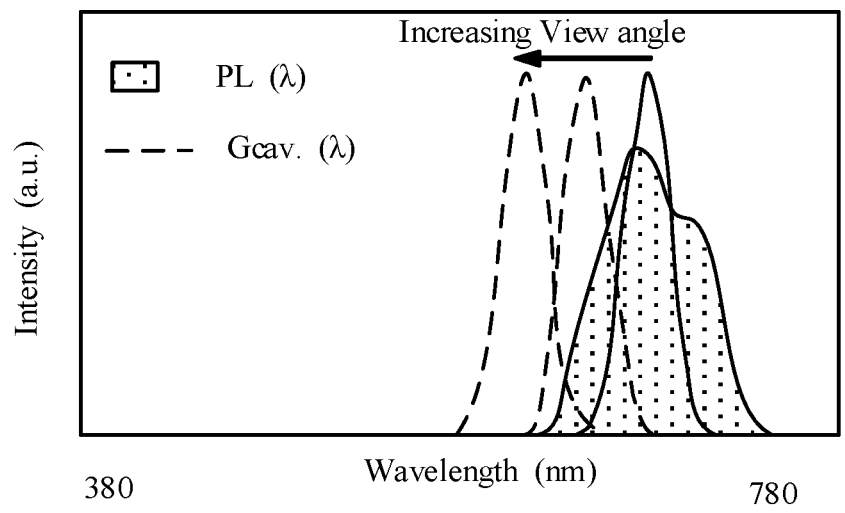
FIG. 3A is a curve graph showing relationships between a microcavity gain spectrum and a viewing angle and between an intrinsic spectrum and the viewing angle, in accordance with some embodiments of the present disclosure.
Figure 3B:
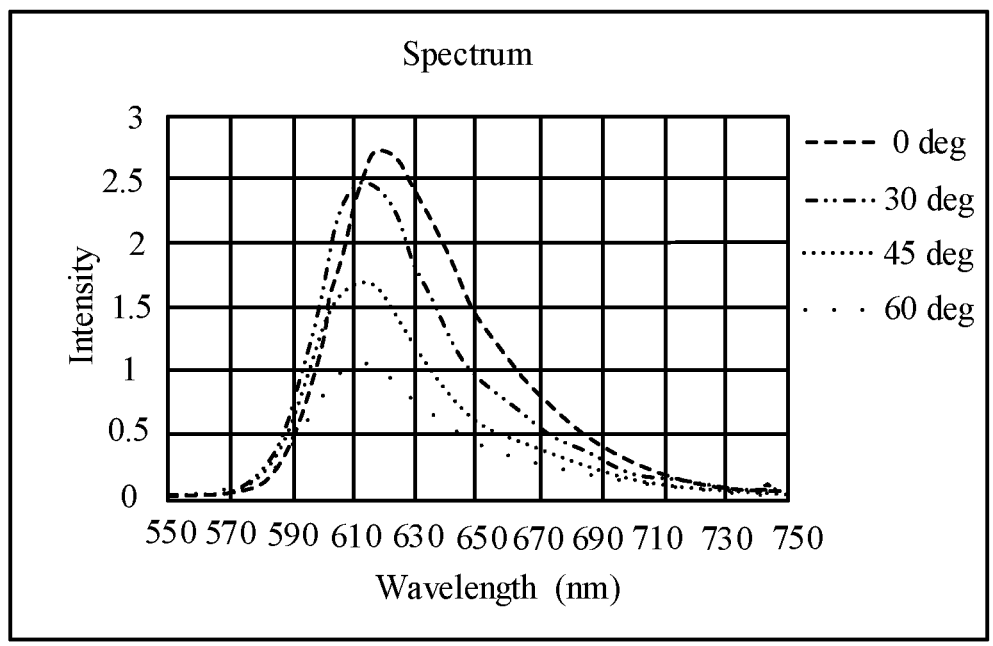
FIG. 3B is a curve graph showing a relationship between a spectrum of light emitted by a light-emitting device and a viewing angle, in accordance with some embodiments of the present disclosure.

According to formulas 1-1 to 1-4, with reference to FIG. 3A, it will be seen that as the viewing angle $\theta$ increases, the value of $\lambda_m$ decreases, and the peak position of the microcavity gain spectrum Gcav.($\lambda$) is blue-shifted, which makes an intensity of the PL($\lambda$) spectrum corresponding to the peak position of the microcavity gain spectrum Gcav.($\lambda$)

decrease; and in a case where an intensity of the microcavity gain spectrum Gcav.($\lambda$) is unchanged, the intensity of the EL($\lambda$) spectrum decreases, thereby causing luminance decay of the light-emitting device D. Referring to FIG. 3B, as the viewing angle $\theta$ increases, an intensity of light emitted by the light-emitting device D gradually decreases (in FIG. 3A and FIG. 3B, the abscissa "Wavelength" represents a wavelength of light, and the ordinate "Intensity" represents an intensity of light).

In addition, materials of light-emitting layers 105 in light-emitting devices D that emit light with different colors are different. Due to influence of material characteristics of the light-emitting layers 105, as the viewing angle $\theta$ increases, EL($\lambda$) spectra of light with different values of $\lambda$ decrease by different values. That is, luminance decay rates of light with different colors emitted by the light-emitting layers 105 made of different materials are different. As a result, as the viewing angle $\theta$ increases, the color shift phenomenon occurs in the image displayed by the display apparatus. According to practical verification, it will be seen that as the viewing angle increases, luminance decay rates of red light and green light are greater than a decay rate of blue light, which makes the image displayed by the display apparatus yellowish in a case of a large viewing angle.

In order to solve a problem of color shift (e.g., yellowing) of the image displayed by the display apparatus as the viewing angle $\theta$ increases, as shown in FIG. 2A, the display substrate 100 further includes a low-refractive-index intercalation layer 110 disposed at a side, away from the backplane 10, of the first light-emitting devices D1 and the second light-emitting devices D2. In a direction S perpendicular to the backplane 10, a transmittance of the low-refractive-index intercalation layer 110 to the first color light is less than a transmittance of the low-refractive-index intercalation layer 110 to the second color light. For example, in a case where the first color light is blue light and the second color light is red light or green light, a transmittance of the low-refractive-index intercalation layer 110 to blue light is less than a transmittance of the low-refractive-index intercalation layer 110 to red light or green light.

As shown in FIG. 2A, the display substrate 100 further includes an encapsulation layer 11. The encapsulation layer 11 includes a first inorganic barrier layer 111, a first organic barrier layer 112 and a second inorganic barrier layer 113 that are sequentially stacked on a side of the low-refractive-index intercalation layer 110 away from the backplane 10. A refractive index of the low-refractive-index intercalation layer 110 is less than a refractive index of the first inorganic barrier layer 111.

The first inorganic barrier layer 111 and the second inorganic barrier layer 113 have a function of blocking moisture and oxygen, and the first organic barrier layer 112 has certain flexibility and a function of absorbing moisture. Therefore, the formed encapsulation layer 11 may enable the display substrate 100 to achieve a good encapsulation effect, and a phenomenon of encapsulation failure is unlikely to occur.

In the display substrate 100 in the above embodiments of the present disclosure, the low-refractive-index intercalation layer 110 and the first inorganic barrier layer 111 are provided at the side, away from the backplane 10, of the first light-emitting devices D1 and the second light-emitting devices D2, and the refractive index of the low-refractive-index intercalation layer 110 is less than the refractive index of the first inorganic barrier layer 111. In the direction S perpendicular to the backplane 10, the transmittance of the low-refractive-index intercalation layer 110 to blue light is less than the transmittance of the low-refractive-index intercalation layer 110 to red light or green light. That is, in the direction S perpendicular to the backplane 10, an amount of red light or green light transmitted through the low-refractive-index intercalation layer 110 is greater than an amount of blue light transmitted through the low-refractive-index intercalation layer 110. Therefore, as the viewing angle increases, the amount of red light or green light transmitted through the low-refractive-index intercalation layer 110 is less than the amount of blue light transmitted through the low-refractive-index intercalation layer 110, that is, a luminance decay rate of red light or green light is greater than a luminance decay rate of blue light. Therefore, a display image on the display apparatus tends to be bluish as the viewing angle increases. In practical applications, that the display image tends to be bluish at a large viewing angle is an ideal display effect, thereby avoiding a problem of yellowing of the image displayed by the display apparatus.

In some embodiments, the display substrate 100 further includes third light-emitting devices D3 capable of emitting third color light that are disposed on the backplane 10. In the direction perpendicular to the backplane 10, the transmittance of the low-refractive-index intercalation layer 110 to the first color light is less than a transmittance of the low-refractive-index intercalation layer 110 to the third color light.

It is mentioned above that the second color light emitted by the second light-emitting devices D2 is one of red light or green light. Here, the third color light emitted by the third light-emitting devices D3 is the other of red light or green light. For example, the second color light emitted by a second light-emitting device D2 is red light, and the third color light emitted by a third light-emitting device D3 is green light. The second light-emitting device D2 is at least a portion of a red sub-pixel, and the third light-emitting device D3 is at least a portion of a green sub-pixel. That is, the second light-emitting device D2 is located in a sub-pixel area P where the red sub-pixel is located, and the third light-emitting device D3 is located in a sub-pixel area P where the green sub-pixel is located; alternatively, the second color light emitted by a second light-emitting device D2 is green light, and the third color light emitted by a third light-emitting device D3 is red light. The second light-emitting device D2 is at least a portion of a green sub-pixel, and the third light-emitting device D3 is at least a portion of a red sub-pixel. That is, the second light-emitting device D2 is located in a sub-pixel area P where the green sub-pixel is located, and the third light-emitting device D3 is located in a sub-pixel area P where the red sub-pixel is located.

Through the above arrangement, in the direction S perpendicular to the backplane 10, the transmittance of the low-refractive-index intercalation layer 110 to the first color light is less than the transmittance of the low-refractive-index intercalation layer 110 to the third color light, that is, the transmittance of the low-refractive-index intercalation layer 110 to blue light is less than the transmittance of the low-refractive-index intercalation layer 110 to red light or green light. Therefore, in the direction S perpendicular to the backplane 10, the amount of red light or green light transmitted through the low-refractive-index intercalation layer 110 is greater than the amount of blue light transmitted through the low-refractive-index intercalation layer 110, and the display image of the display apparatus tends to be bluish as the viewing angle increases.

In some embodiments, the refractive index of the low-refractive-index intercalation layer 110 is in a range from 1.45 to 1.73, inclusive, such as 1.45, 1.47, 1.52, 1.59, 1.66 or 1.73.

In some embodiments, a thickness of the low-refractive-index intercalation layer 110 is in a range from 0.03 μm to 0.10 μm, inclusive, such as 0.03 μm, 0.05 μm, 0.065 μm, 0.08 μm or 0.10 μm.

In some embodiments, a material of the low-refractive-index intercalation layer 110 is an inorganic material. For example, the material of the low-refractive-index intercalation layer 110 may include silicon oxide and silicon oxynitride. By adjusting a ratio of silicon oxide to silicon oxynitride, a density of the low-refractive-index intercalation layer 110 may be adjusted, thereby adjusting the refractive index of the low-refractive-index intercalation layer 110.

For example, in a case where the refractive index of the low-refractive-index intercalation layer 110 is in a range from 1.6 to 1.73, inclusive, the ratio of silicon oxide to silicon oxynitride is in a range from 0.001 to 0.1, inclusive.

In some embodiments, the refractive index of the first inorganic barrier layer 111 is in a range from 1.75 to 1.85, inclusive, such as 1.75, 1.78, 1.8, 1.82 or 1.85.

In some embodiments, a sum of a thickness of the first inorganic barrier layer 111 and the thickness of the low-refractive-index intercalation layer 110 is less than or equal to 1.1 μm, and the thickness of the first inorganic barrier layer 111 may be adjusted according to the thickness of the low-refractive-index intercalation layer 110.

In some embodiments, the thickness of the low-refractive-index intercalation layer 110 is less than the thickness of the first inorganic barrier layer 111.

For example, in a case where the thickness of the low-refractive-index intercalation layer 110 is in a range from 0.03 μm to 0.10 μm, inclusive, the thickness of the first inorganic barrier layer 111 is in a range from 1.0 μm to 1.07 μm, inclusive. For example, the thickness of the first inorganic barrier layer 111 may be 1.0 μm, 1.02 μm, 1.035 μm, 1.06 μm or 1.07 μm.

In some embodiments, a material of the first inorganic barrier layer 111 includes silicon oxynitride.

Figure 2B:
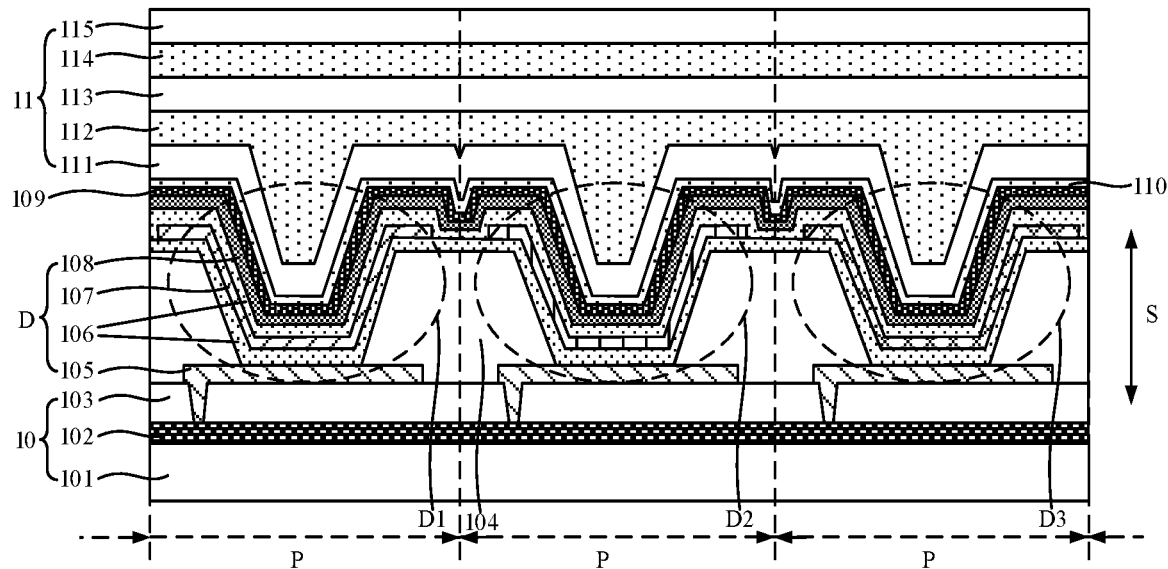
FIG. 2B is a partial cross-sectional view of another display substrate, in accordance with some embodiments of the present disclosure.

In some embodiments, as shown in FIG. 2B, the encapsulation layer 11 further includes a second organic barrier layer 114 and a third inorganic barrier layer 115 that are sequentially stacked on a side of the second inorganic barrier layer 113 away from the backplane 10. The second organic barrier layer 114 has a same function as the first organic barrier layer 112, that is, the second organic barrier layer 114 has a certain flexibility and a function of absorbing moisture, etc. The third inorganic barrier layer 115 has a same function as the first inorganic barrier layer 111 and the second inorganic barrier layer 113, that is, the third inorganic barrier layer 115 has a function of blocking moisture and oxygen, etc. Through the above arrangement, the encapsulation effect of the display substrate 100 may be further improved.

Based on the above embodiments, display substrates 100 each in following embodiments are provided to improve the color shift phenomenon at a large viewing angle to obtain a display effect (e.g., a bluish display effect at a large viewing angle) meeting a viewing requirement, which is verified by simulation experiments.

In some embodiments, as shown in FIG. 2A, the display substrate 100 further includes a light extraction layer (i.e., capping layer (CPL)) 109 disposed on the side, away from the backplane 10, of the first light-emitting devices D1 and the second light-emitting devices D2, and the light extraction layer 109 is located on a side of the low-refractive-index intercalation layer 110 proximate to the backplane 10. The refractive index of the low-refractive-index intercalation layer 110 is less than a refractive index of the light extraction layer 109, and a light-emitting efficiency of the display substrate 100 may be improved by the light extraction layer 109.

For example, the refractive index of the light extraction layer 109 is in a range from 1.8 to 2.0, such as 1.8, 1.85, 1.9, 1.95 or 2.0, inclusive.

For example, a thickness of the light extraction layer 109 is in a range from 0.06 μm to 0.09 μm, inclusive, such as 0.06 μm, 0.07 μm, 0.075 μm, 0.08 μm or 0.09 μm.

For example, a material of the light extraction layer 109 may include an organic small molecule material, such as an imidazole-based material.

In some embodiments, in a case where the display substrate 100 includes the light extraction layer 109, the refractive index of the low-refractive-index intercalation layer 110 is in a range from 1.45 to 1.63, inclusive, such as 1.45, 1.50, 1.54, 1.60 or 1.63.

In some embodiments, in a case where the display substrate 100 includes the light extraction layer 109, the thickness of the low-refractive-index intercalation layer 110 is in a range from 0.03 μm to 0.10 μm, such as 0.03 μm, 0.05 μm, 0.065 μm, 0.08 μm or 0.10 μm.

In the related art, in a microcavity structure of a light-emitting device, a semi-transparent reflective mirror structure includes a cathode layer, a light extraction layer and a protective layer that are stacked in sequence. Layers through which a light exit path of the light-emitting device passes are the cathode layer, the light extraction layer, the protective layer, a first inorganic barrier layer, an organic barrier layer and a second inorganic barrier layer in sequence. A material of the protective layer includes lithium fluoride (chemical formula: LiF) for blocking plasma introduced in a subsequent process of manufacturing the first inorganic barrier layer, so as to prevent plasma from intruding into the light extraction layer to affect optical performance of the light extraction layer.

In the above embodiments of the present disclosure, as shown in FIG. 2A, a thickness of a protective layer is set to 0 Å, that is, the protective layer is omitted, that is, the lithium fluoride is omitted, and thus the semi-transparent reflective mirror structure includes the cathode layer 108 and the light extraction layer 109. The low-refractive-index intercalation layer 110 is added to a layer structure through which the light exit path of the light-emitting device D passes, and layers through which the light exit path passes are the cathode layer 108, the light extraction layer 109, the low-refractive-index intercalation layer 110, the first inorganic barrier layer 111, the first organic barrier layer 112 and the second inorganic barrier layer 113 in sequence.

Through the above arrangement, the protective layer is omitted and the low-refractive-index intercalation layer 110 is added, which may improve the color shift phenomenon of the display image of the display apparatus at a large viewing angle.

In order to verify the above conclusion, the following simulation experiments are carried out.

Figure 4:
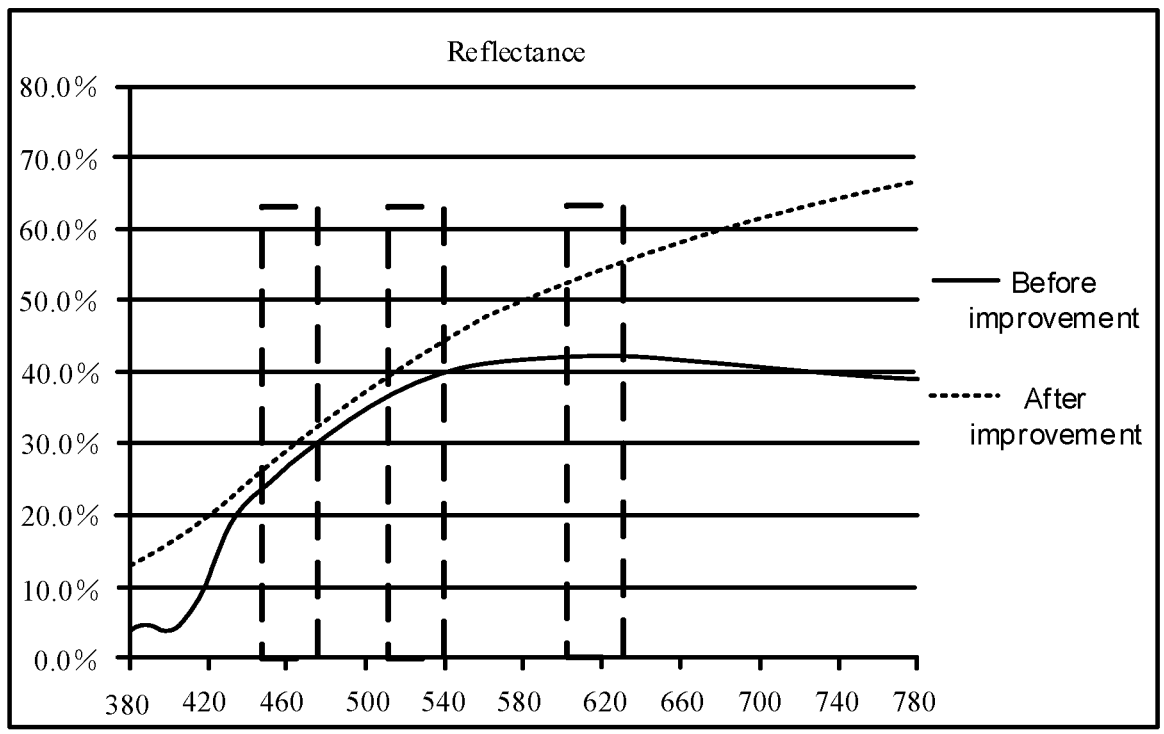
FIG. 4 is a curve graph of reflectances of semi-transparent reflective mirror structures, in accordance with some embodiments of the present disclosure.

First, SETFOS software is used to simulate experiments in which white light (a wavelength thereof is in a range from 380 nm to 780 nm, inclusive) passes through two semi-transparent reflective mirror structures before and after the protective layer is omitted, and reflectances R2 of the two semi-transparent reflective mirror structures are measured. FIG. 4 is a curve graph of the reflectances of the semi-transparent reflective mirror structures. The curve "before improvement" is a reflectance curve of the semi-transparent reflective mirror structure before the protective layer is omitted, and the curve "after improvement" is a reflectance curve of the semi-transparent reflective mirror structure after the protective layer is omitted. It will be seen that in cases where a wavelength λ is close to or equal to 620 nm and a wavelength λ is close to or equal to 530 nm, the reflectance of the semi-transparent reflective mirror structure after the protective layer is omitted increases; and in a case where the wavelength λ is close to or equal to 460 nm, the reflectance of the semi-transparent reflective mirror structure after the protective layer is omitted is the same or approximately the same as the reflectance of the semi-transparent reflective mirror structure before the protective layer is omitted.

It will be seen from the above formula 1-3 that in cases where the wavelength λ is close to or equal to 620 nm and the wavelength λ is close to or equal to 530 nm, and the reflectance R1 of the reflective mirror structure is unchanged, the reflectance R2 of the semi-transparent reflective mirror structure increases, the microcavity gain spectrum Gcav.(λ) of the microcavity structure increases, and the microcavity effect thereof is enhanced; and as a result, half-widths of EL(λ) spectra of red light (a wavelength of 620 nm) and green light (a wavelength of 530 nm) decrease. Similarly, before and after the protective layer is omitted, a half-width of the EL(λ) spectrum of blue light (a wavelength of 460 nm) is unchanged or approximately unchanged.

Figure 5A:
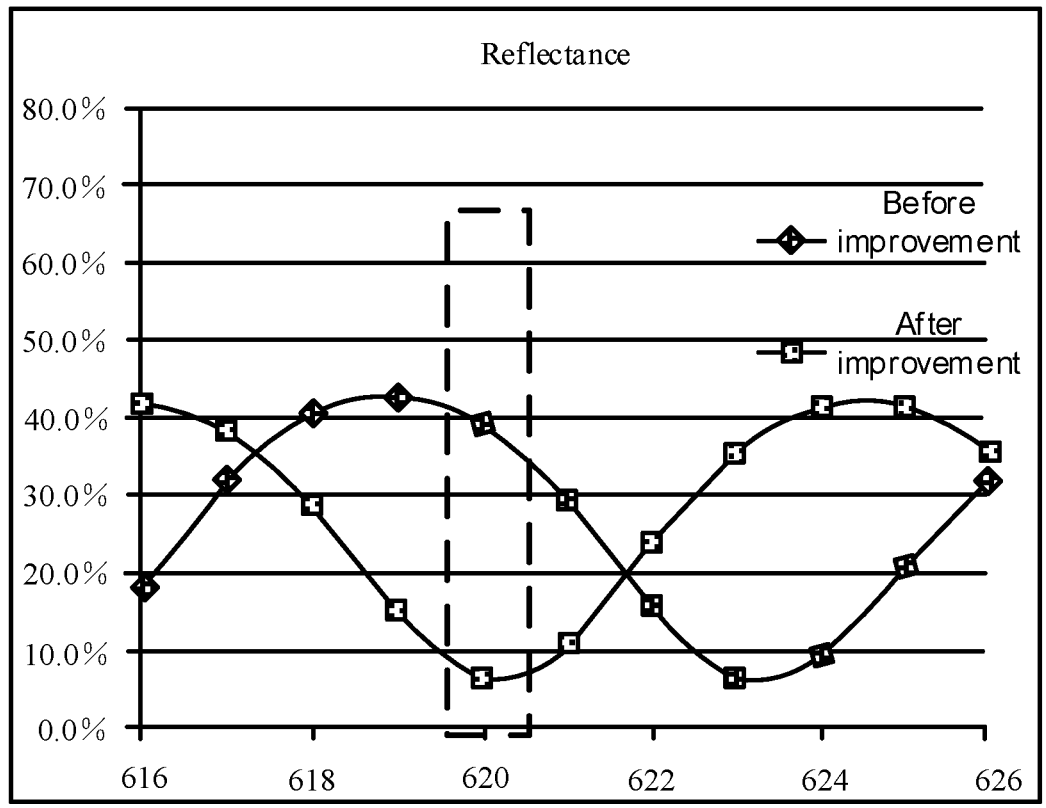
FIG. 5A to FIG. 5C are curve graphs showing reflectances of layer structures through which light exit paths pass before and after improvement, in accordance with some embodiments of the present disclosure.
Figure 5B:
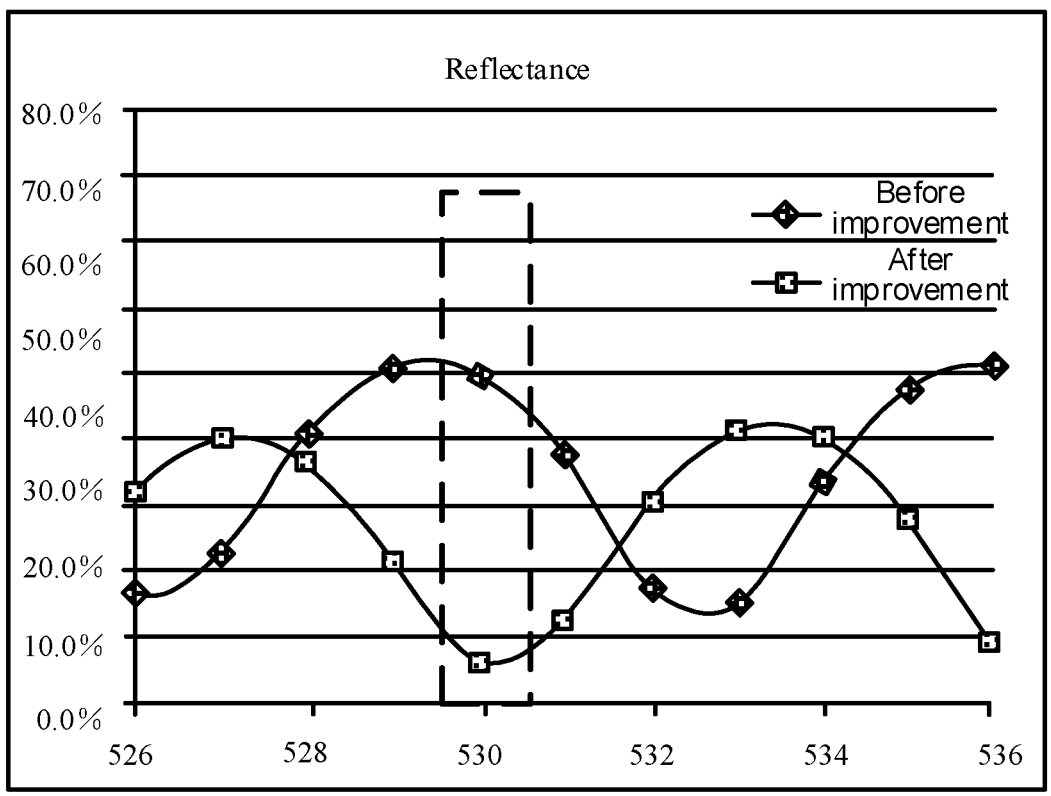
Figure 5C:
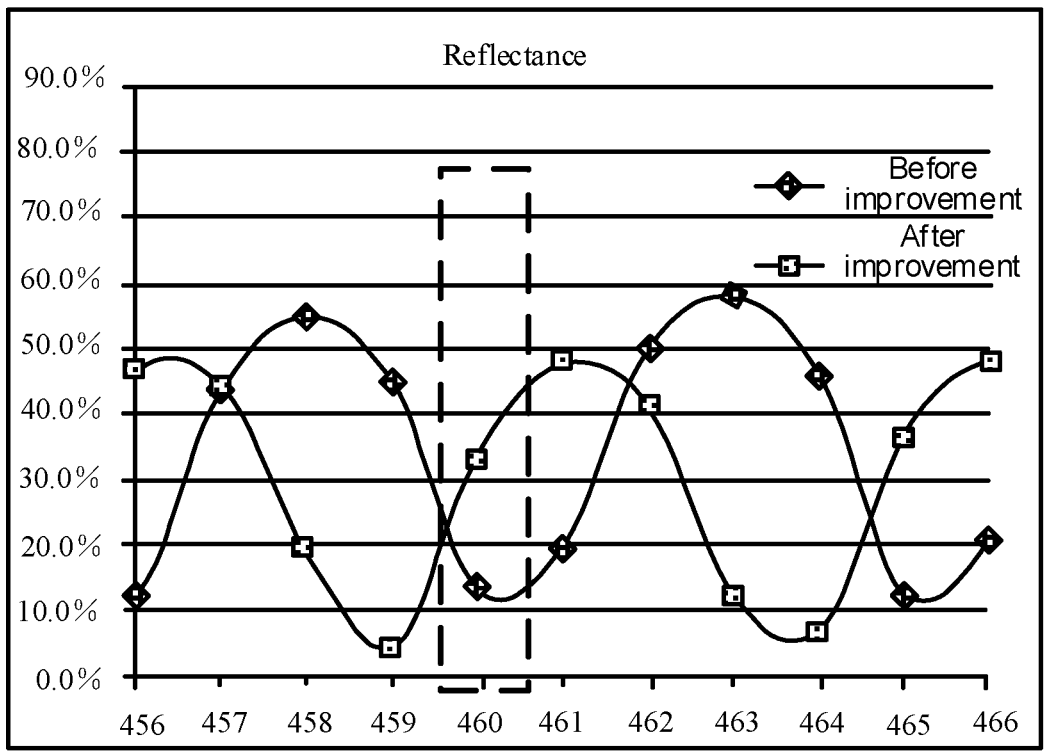

Then, the SETFOS software is used to simulate experiments in which white light passes through layer structures through which two light exit paths before and after the protective layer is omitted pass, and reflectances and transmittances of the layer structures through which the two light exit paths pass are measured. After the protective layer is omitted, the low-refractive-index intercalation layer 110 is added to the layer structure through which the light exit path passes, and in the direction S perpendicular to the backplane 10, transmittances of the low-refractive-index intercalation layer 110 to red light and green light are greater than the transmittance of the low-refractive-index intercalation layer 110 to blue light. Therefore, as shown in FIGS. 5A and 5B, it will be seen that in the cases where the wavelength λ is close to or equal to 620 nm and the wavelength λ is close to or equal to 530 nm, reflectances of the layer structure through which the light exit path passes to red light and green light decrease. As shown in FIG. 5C, in the case where the wavelength λ is close to or equal to 460 nm, a reflectance of the layer structure through which the light exit path passes to blue light is unchanged or approximately unchanged.

Figure 6A:
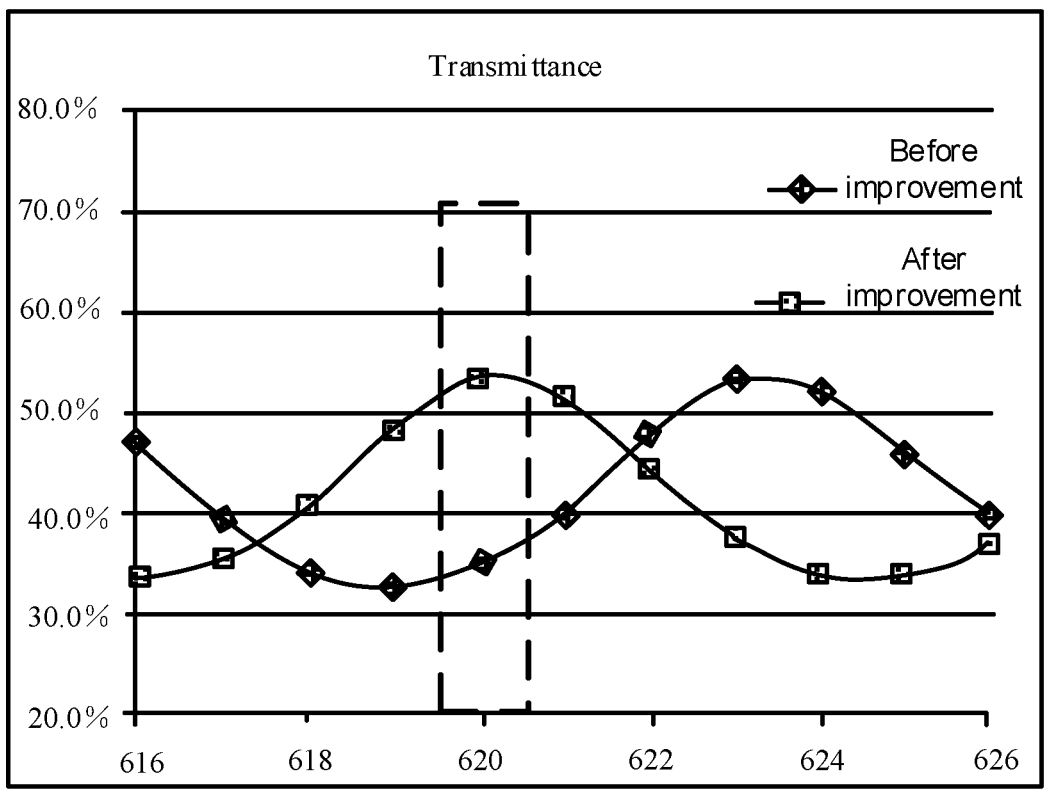
FIG. 6A to FIG. 6C are curve graphs showing transmittances of layer structure through which light exit paths pass before and after improvement, in accordance with some embodiments of the present disclosure.
Figure 6B:
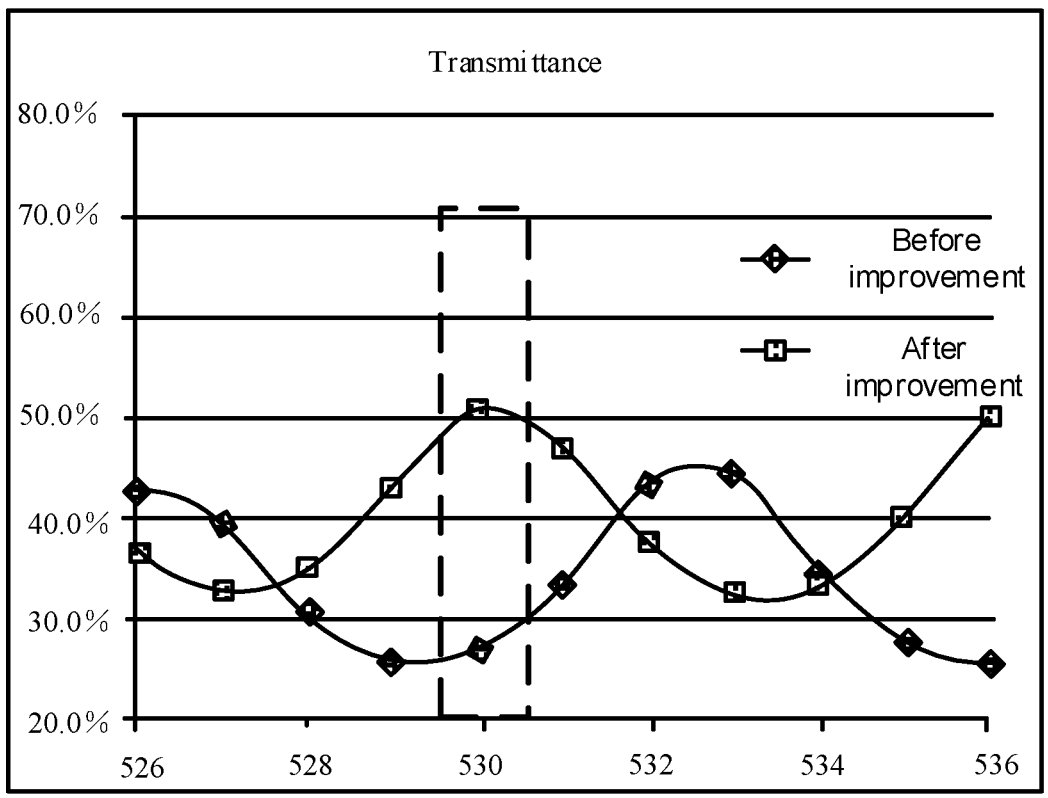
Figure 6C:
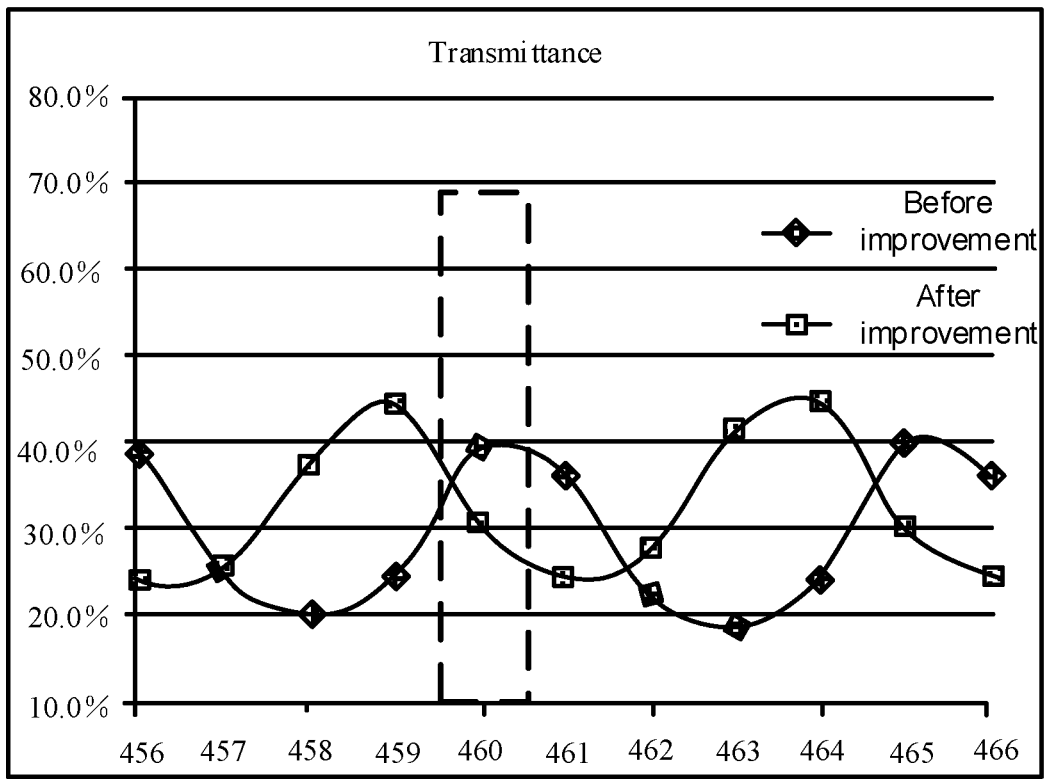

As shown in FIGS. 6A and 6B, the curve "before improvement" is a transmittance curve of the layer structure through which the light exit path passes before the protective layer is omitted. The curve "after improvement" is a transmittance curve of the layer structure through which the light exit path passes after the protective layer is omitted. It will be seen that in the cases where the wavelength λ is close to or equal to 620 nm and the wavelength λ is close to or equal to 530 nm, transmittances of the layer structure through which the light exit path passes to red light and green light increase. As shown in FIG. 6C, in the case where the wavelength λ is close to or equal to 460 nm, a reflectance and a transmittance of the layer structure through which the light exit path passes to blue light are unchanged or approximately unchanged.

Figure 7A:
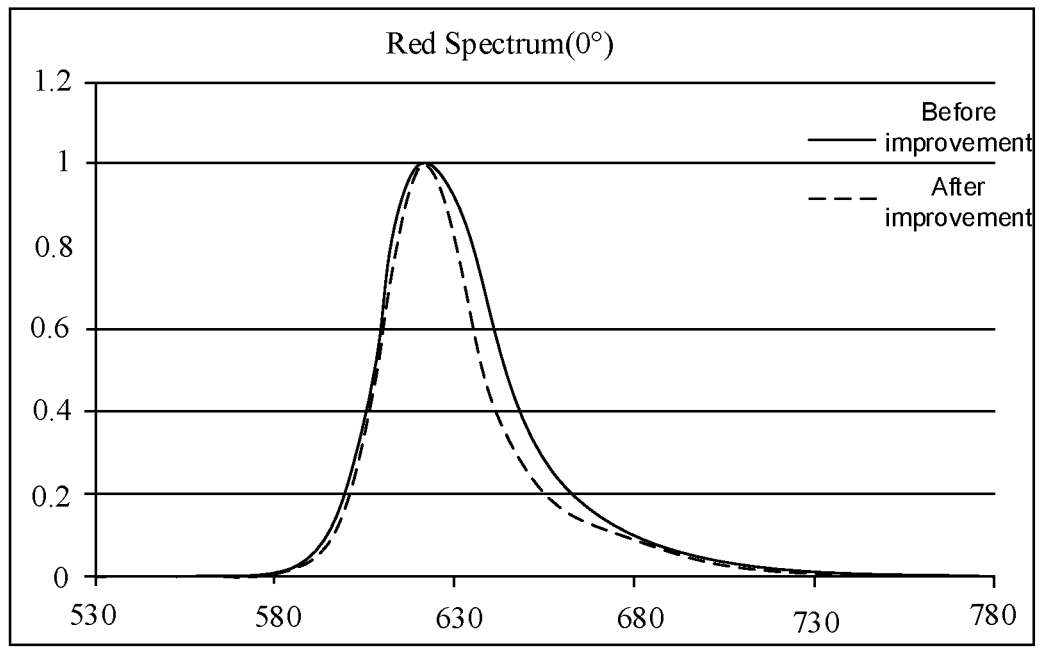
FIG. 7A to FIG. 7C are curve graphs showing spectra of light emitted by display substrates before and after improvement, in accordance with some embodiments of the present disclosure.
Figure 7B:
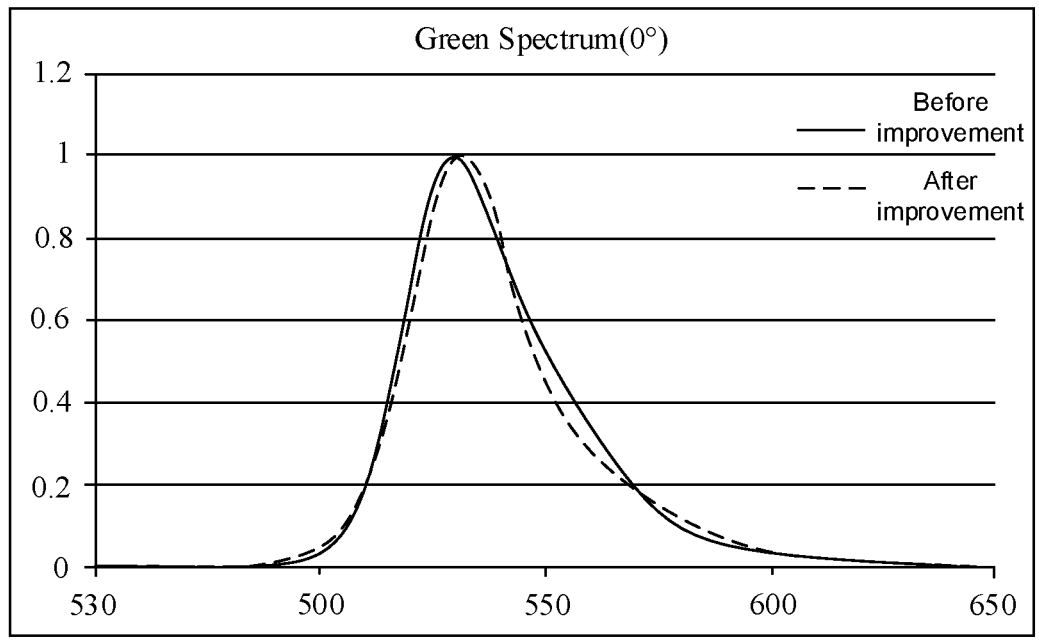
Figure 7C:
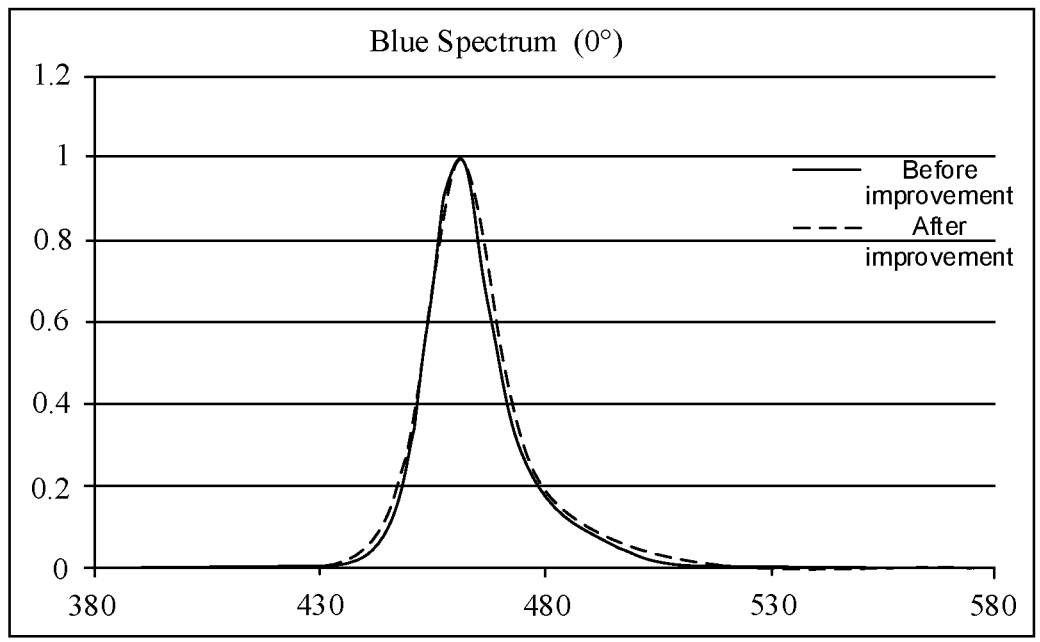

FIGS. 7A to 7C are respectively curve graphs showing actually measured EL(λ) spectra of red light, green light and blue light before and after the protective layer is omitted from the display substrate 100 and the low-refractive-index intercalation layer 110 is added to the display substrate 100. The curves "before improvement" are actually measured EL(λ) spectrum curves of red light, green light and blue light before the protective layer is omitted and the low-refractive-index intercalation layer 110 is added. The curves "after improvement" are actually measured EL(λ) spectrum curves of red light, green light and blue light after the protective layer is omitted and the low-refractive-index intercalation layer 110 is added. It will be seen that, in the display substrate 100 in the embodiments of the present disclosure, as shown in FIGS. 7A and 7B, the half-widths of the EL(λ) spectra of red light and green light are both reduced; and as shown in FIG. 7C, the half-width of the EL(λ) spectrum of blue light is unchanged or approximately unchanged.

Figure 8A:
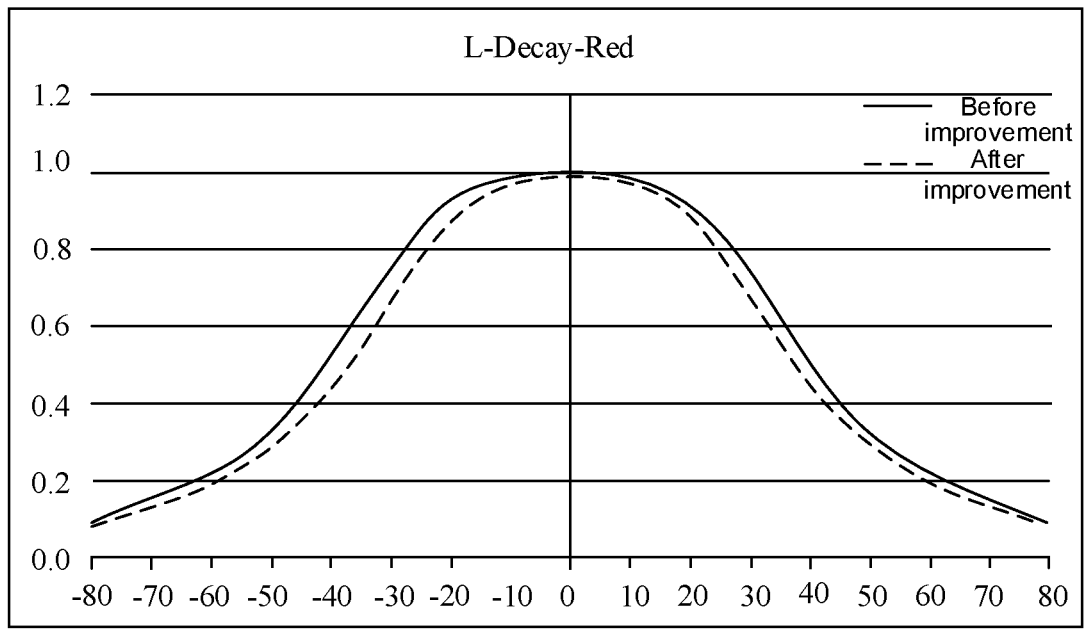
FIG. 8A to FIG. 8C are curve graphs showing luminance decay of light emitted by display substrates before and after improvement, in accordance with some embodiments of the present disclosure.
Figure 8B:
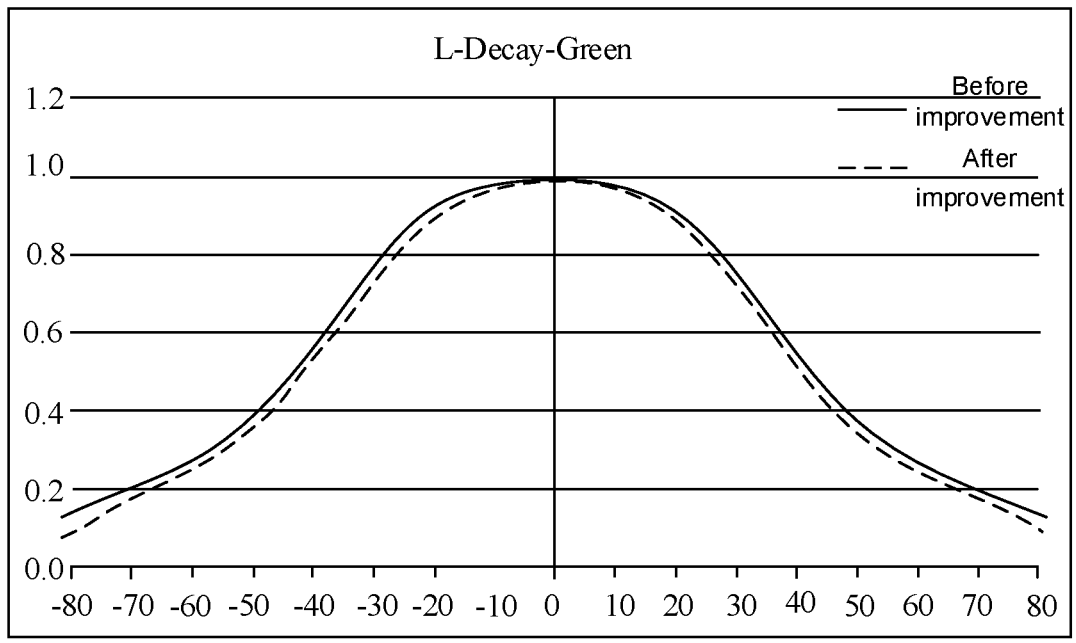
Figure 8C:
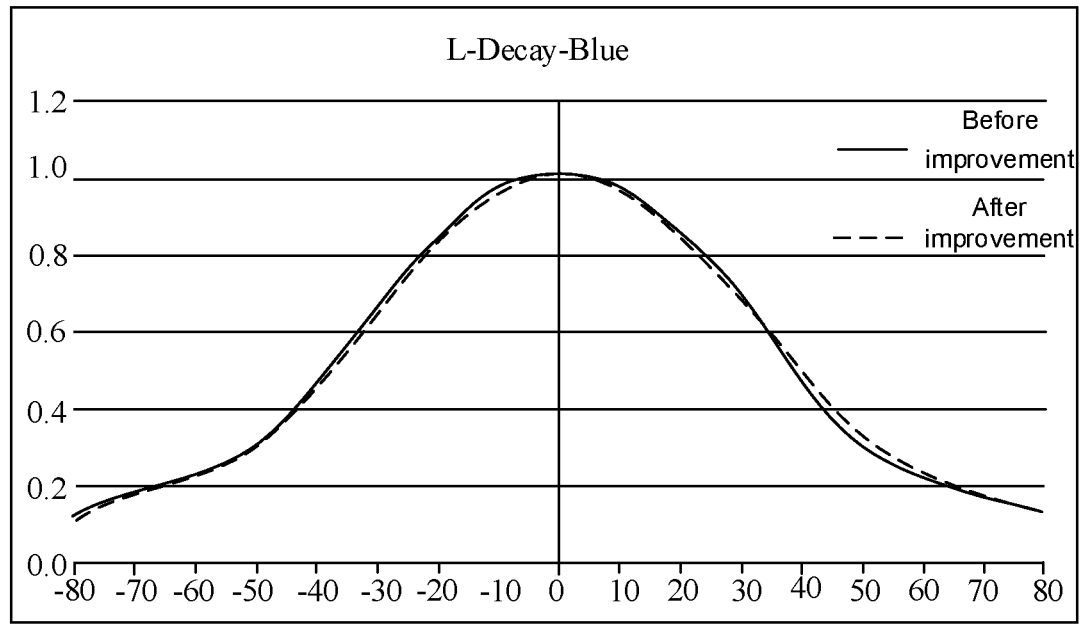

FIGS. 8A to 8C are respectively L-Decay curve graphs of red light, green light and blue light before and after the protective layer is omitted from the display substrate 100 and the low-refractive-index intercalation layer 110 is added to the display substrate 100. The curves "before improvement" are L-Decay curves of red light, green light and blue light before the protective layer is omitted and the low-refractive-index intercalation layer 110 is added. The curves "after improvement" are L-Decay curves of red light, green light and blue light after the protective layer is omitted and the low-refractive-index intercalation layer 110 is added. It will be seen that, as shown in FIGS. 8A and 8B, in the display substrate 100 in the embodiments of the present disclosure, luminance decay rates of red light and green light increase as the viewing angle increases; and as shown in FIG. 8C, a luminance decay rate of blue light is unchanged or approximately unchanged as the viewing angle increases.

Figure 9A:
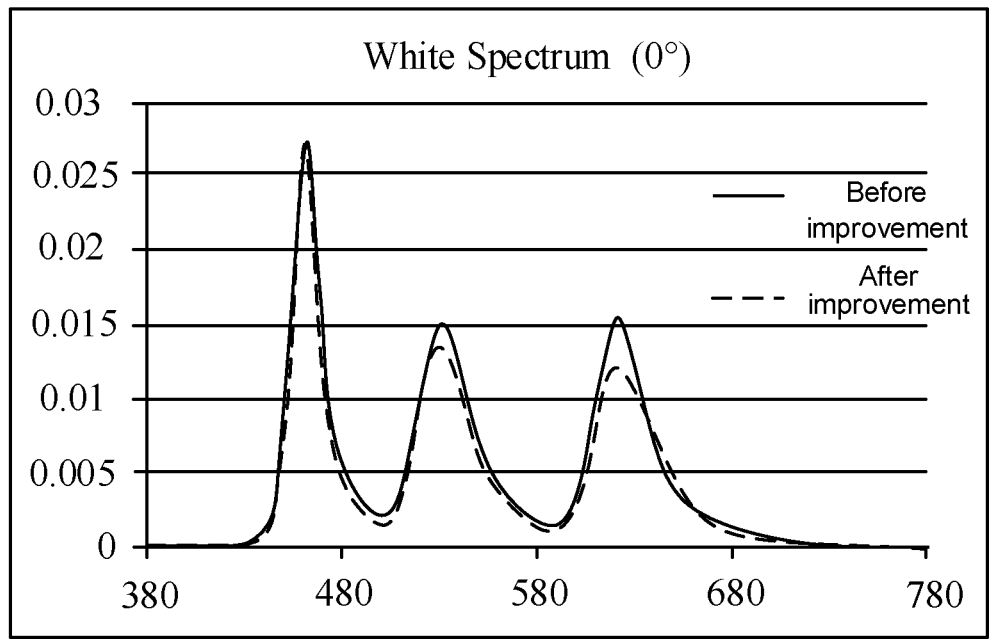
FIG. 9A to FIG. 9C are curve graphs showing spectra of light emitted by display substrates before and after improvement at different viewing angles, in accordance with some embodiments of the present disclosure.
Figure 9B:
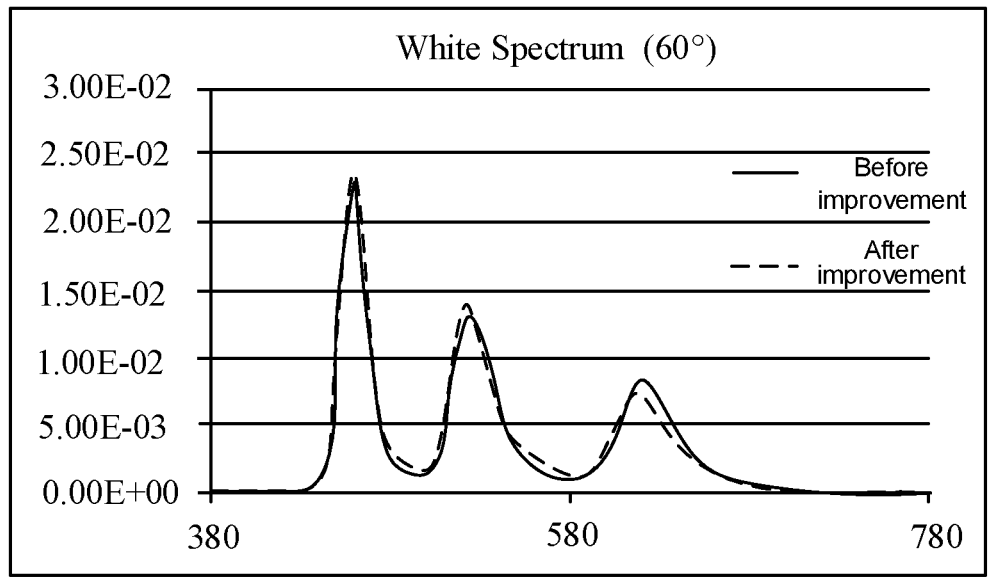
Figure 9C:
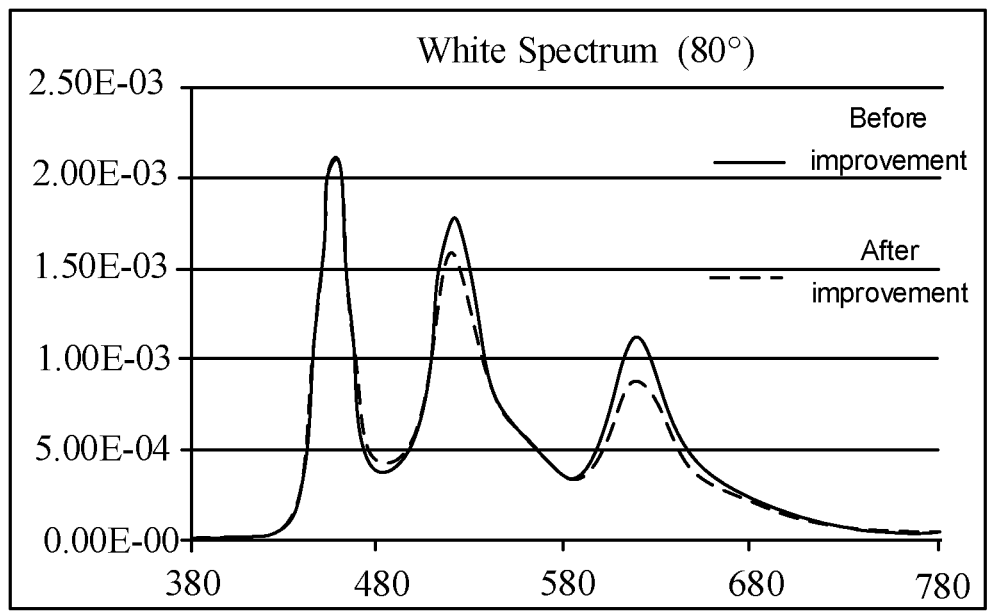

FIGS. 9A to 9C are respectively EL(λ) spectrum curve graphs of red light, green light and blue light at different viewing angles before and after the protective layer is omitted from the display substrate 100 and the low-refractive index intercalation layer 110 is added to the display substrate 100. The curve "before improvement" is an actually measured EL(λ) spectrum curve of white light before the protective layer is omitted and the low-refractive-index intercalation layer 110 is added. The curve "after improvement" is an actually measured EL(λ) spectrum curve of white light after the protective layer is omitted and the low-refractive-index intercalation layer 110 is added. It will be seen that, as shown in FIGS. 9A to 9C, in the display substrate 100 in the embodiments of the present disclosure, as the viewing angle increases, luminance decay rates of red light and green light increase, and a luminance decay rate of blue light is unchanged or approximately unchanged.

In summary, after the protective layer is omitted, reflectances R2 of the semi-transparent reflective mirror structure to red light and green light increase, so that the microcavity effect of the microcavity structure is enhanced. Therefore, after the low-refractive-index intercalation layer 110 is added, in the direction perpendicular to the backplane 10, transmittances of the layer structure through which the light exit path passes to red light and green light are greater than a transmittance of the layer structure to blue light.

Figure 10:
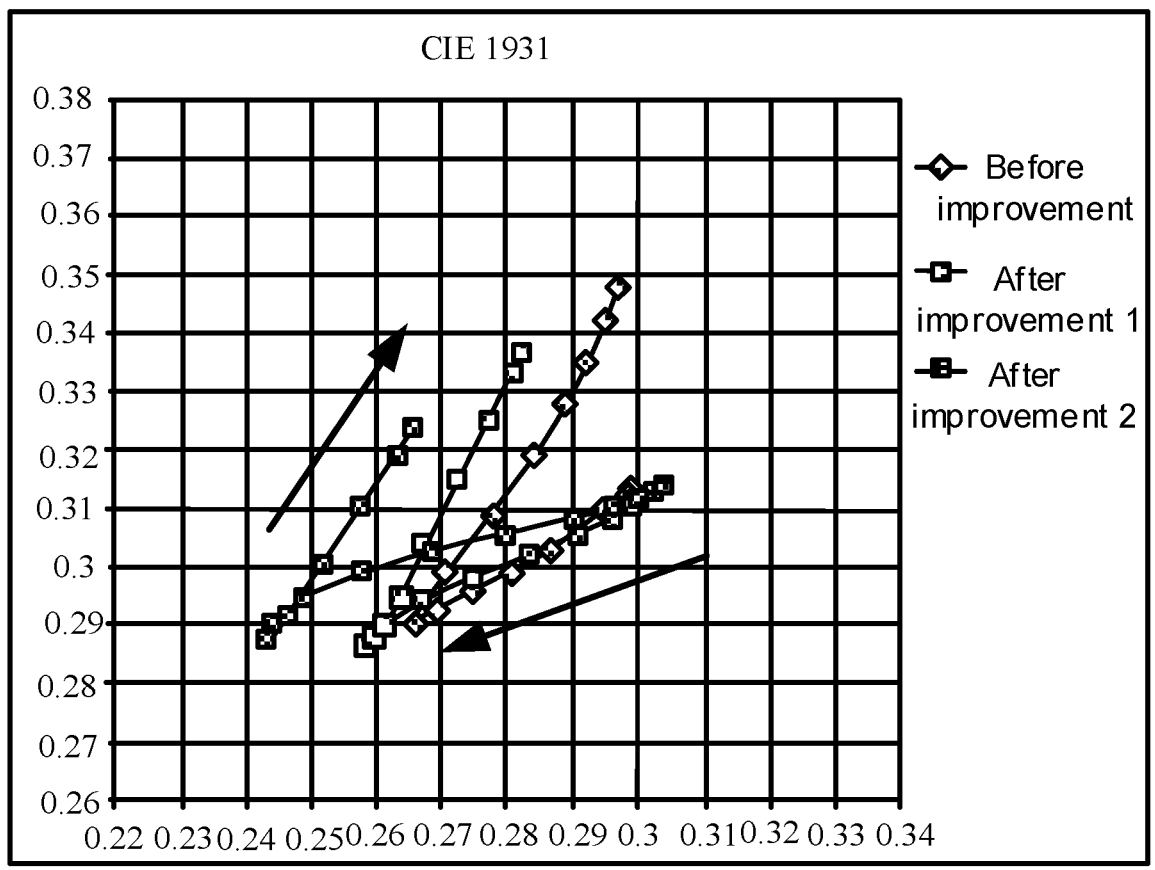
FIG. 10 is a diagram showing color shift trajectories of images displayed by display substrates before and after improvement, in accordance with some embodiments of the present disclosure.

FIG. 10 is a diagram showing color shift trajectories (in CIE 1931) of images displayed by the display substrate. The curve "before improvement" is a color gamut curve before the protective layer is omitted and the low-refractive-index intercalation layer 110 is added. The curve "after improvement 1" is a color gamut curve after the protective layer is omitted and the low-refractive-index intercalation layer 110 is added. As the viewing angle of the display apparatus increases (a direction indicated by an arrow in which the curve "before improvement" is), the display image of the display apparatus tends to be yellowish (an end point of the curve "before improvement" along the arrow is located in a yellow gamut) at a large viewing angle; and as the viewing angle of the display apparatus increases (a direction indicated by an arrow in which the curve "after improvement 1" is), the luminance decay rates of red light and green light are greater than the luminance decay rate of blue light. Therefore, the display image of the display apparatus tends to be bluish at a large viewing angle (an end point of the curve "after improvement 1" along the arrow is located in an aqua blue gamut), so that the color shift phenomenon is improved.

In addition, in some embodiments, the refractive index and/or the thickness of the first inorganic barrier layer 111 may be adjusted to obtain the display effect (e.g., a bluish display effect at a large viewing angle) meeting the viewing requirement, so as to improve the color shift phenomenon of the display image of the display apparatus at a large viewing angle.

For example, the thickness of the first inorganic barrier layer 111 is increased. Referring to FIG. 10, the curve "after improvement 2" is a color gamut curve after the protective layer is omitted, the low-refractive-index intercalation layer 110 is added, and the thickness of the first inorganic barrier layer 111 is increased. As the viewing angle of the display apparatus increases (the direction indicated by the arrow in which the curve "after improvement 2" is), the luminance decay rates of red light and green light are greater than the luminance decay rate of blue light. Therefore, the display image of the display apparatus tends to be bluish (an end point of the curve "after improvement 2" along the arrow is located in a blue gamut) at a large viewing angle, so that the color shift phenomenon is improved.

Figure 11:
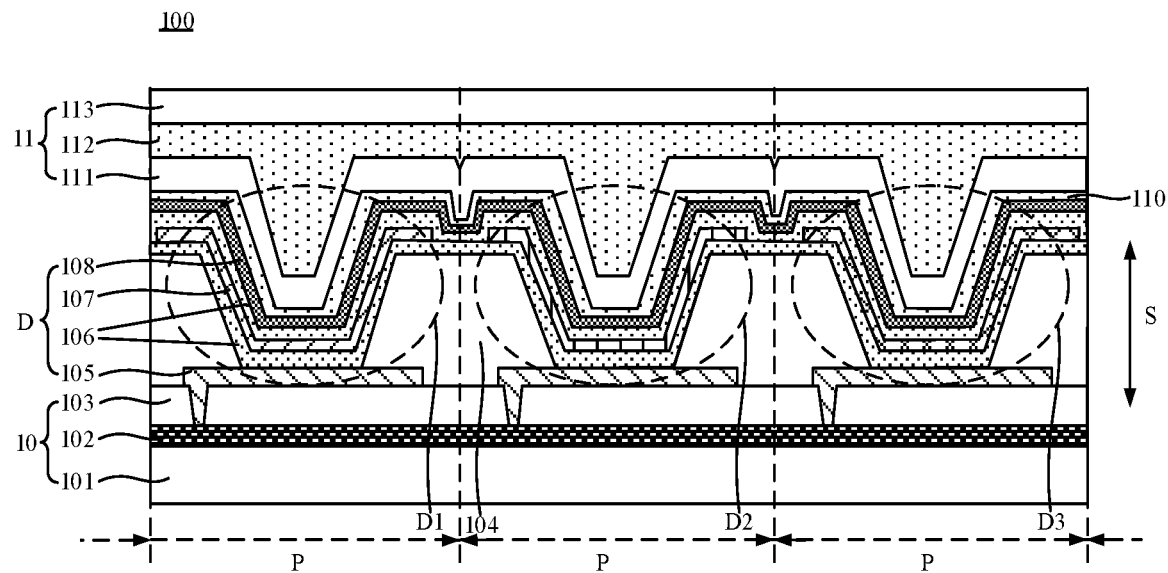
FIG. 11 is a partial cross-sectional view of yet another display substrate, in accordance with some embodiments of the present disclosure.

In some other embodiments, as shown in FIG. 11, the protective layer and the light extraction layer 109 are omitted, so that the low-refractive-index intercalation layer 110 is in direct contact with the cathode layer 108, which may reduce the material cost required for manufacturing the display substrate 100. In addition, the semi-transparent reflective mirror structure includes the cathode layer 108, and the low-refractive-index intercalation layer 110 is added to the layer structure through which the light exit path of the light-emitting device D passes. The layer structure includes the cathode layer 108, the low-refractive-index intercalation layer 110, the first inorganic barrier layer 111, the first organic barrier layer 112 and the second inorganic barrier layer 113.

In some embodiments, in a case where the light extraction layer 109 is omitted from the display substrate 100, the refractive index of the low-refractive-index intercalation layer 110 is in a range from 1.47 to 1.73, inclusive, such as 1.47, 1.52, 1.60, 1.65 or 1.73.

In some embodiments, in the case where the light extraction layer 109 is omitted from the display substrate 100, the thickness of the low-refractive-index intercalation layer 110 is in a range from 0.05 μm to 0.10 μm, inclusive, such as 0.05 μm, 0.075 μm, 0.08. μm or 0.10 μm.

Through the above arrangement, the protective layer and the light extraction layer 109 are omitted, and the low-refractive-index intercalation layer 110 is in direct contact with the cathode layer 108, which may improve a color shift phenomenon of the display image of the display apparatus at a large viewing angle.

In order to verify the above conclusion, the following simulation experiments are carried out.

First, the SETFOS software is used to simulate experiments in which white light passes through layer structures through which light exit paths pass before the protective layer and the light extraction layer 109 are omitted, after the protective layer and the light extraction layer 109 are omitted, and after the protective layer and the light extraction layer 109 are omitted and the low-refractive-index intercalation layer 110 is added, and a white efficiency (Weff.) of a layer structure through which each light exit path passes is measured, which are shown in Table 1 below.

TABLE 1

| Split | Weff. (Avg) |
|---|---|
| Normal | 56.4 |
| LiF & CPL Skip | 53.3 |
| LiF & CPL Skip & 110 (value of n) | 54.6 |
| LiF & CPL Skip & 110 (thickness) | 55.0 |

"Split" refers to the layer structures through which different types of light exit paths pass; "Weff. (Avg)" refers to an average value of white efficiencies; "Normal" refers to a layer structure through which the light exit path passes before the protective layer and the light extraction layer 109 are omitted; "LiF & CPL Skip" refers to a layer structure through which the light exit path passes after the protective layer and the light extraction layer 109 are omitted; "LiF & CPL Skip & 110 (value of n)" refers to a layer structure through which the light exit path passes after the protective layer and the light extraction layer 109 are omitted and the low-refractive-index intercalation layer 110 is added, in a case where the refractive index of the low-refractive-index intercalation layer 110 is in the range from 1.47 to 1.73, inclusive; and "LiF & CPL Skip & 110 (thickness)" refers to a layer structure through which the light exit path passes after the protective layer and the light extraction layer 109 are omitted and the low-refractive-index intercalation layer 110 is added, in a case where the thickness of the low-refractive-index intercalation layer 110 is in the range from 0.05 μm to 0.10 μm, inclusive.

It will be seen from Table 1 that, in the case where the refractive index of the low-refractive-index intercalation layer 110 is in the range from 1.47 to 1.73, inclusive, a white efficiency of the layer structure through which the light exit path passes after the protective layer and the light extraction layer 109 are omitted and the low-refractive-index intercalation layer 110 is added is increased relative to a white efficiency of the layer structure through which the light exit path passes after the protective layer and the light extraction layer 109 are omitted; and an increase value of the white efficiency accounts for about 2.5% of the white efficiency of the layer structure through which the light exit path passes after the protective layer and the light extraction layer 109 are omitted; and in the case where the thickness of the low-refractive-index intercalation layer 110 is in the range from 0.05 μm to 0.10 μm, inclusive, a white efficiency of the layer structure through which the light exit path passes after the protective layer and the light extraction layer 109 are omitted and the low-refractive-index intercalation layer 110 is added is increased relative to the white efficiency of the layer structure through which the light exit path passes after the protective layer and the light extraction layer 109 are omitted; and an increase value of the white efficiency accounts for about 3.2% of the white efficiency of the layer structure through which the light exit path passes after the protective layer and the light extraction layer 109 are omitted.

Figure 12:
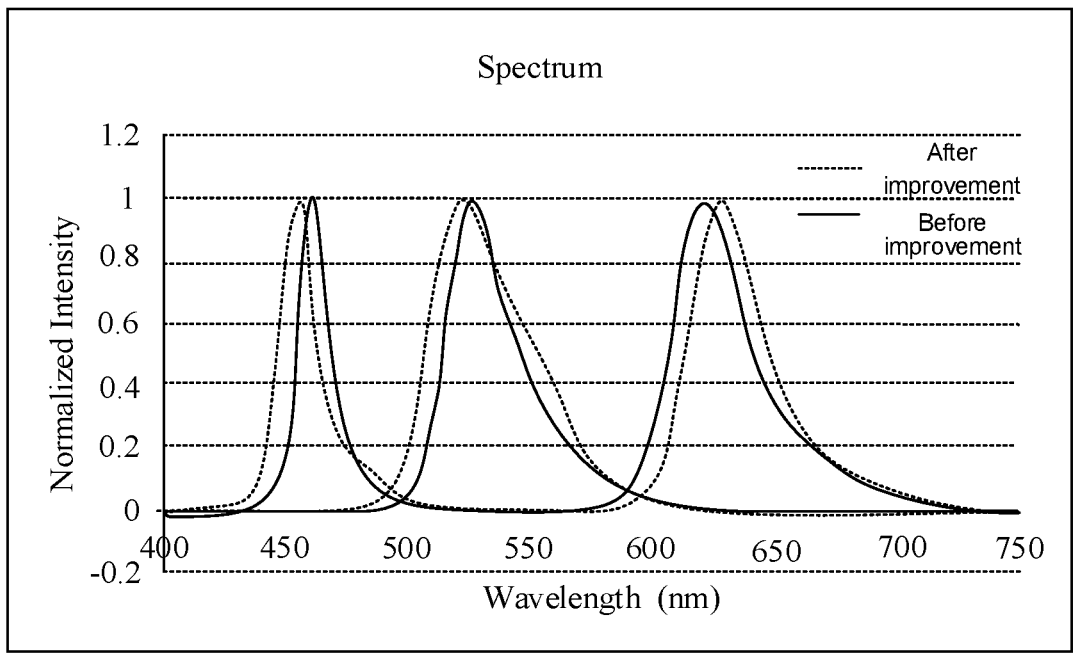
FIG. 12 is a curve graph showing spectra of light emitted by display substrates before and after improvement, in accordance with some embodiments of the present disclosure.

FIG. 12 is a curve graph showing actually measured EL(λ) spectra of red light, green light and blue light of the display substrate 100 before and after the protective layer and the light extraction layer 109 are omitted. The abscissa of the curve graph is Wavelength (nm), and the ordinate thereof is Normalized Intensity. The curve "before improvement" is an actually measured EL(λ) spectrum curve of red light, green light and blue light before the protective layer and the light extraction layer 109 are omitted. The curve "after improvement" is an actually measured EL(λ) spectrum curve of red light, green light and blue light after the protective layer and the light extraction layer 109 are omitted. It will be seen that, in the display substrate 100 in the embodiments of the present disclosure, red light is red-shifted (shifted towards a direction of increasing wavelength), and green light and blue light are blue-shifted (shifted towards a direction of decreasing wavelength); and compared with a fact that half-widths of the EL(λ) spectra of red light and blue light are unchanged or approximately unchanged, a half-width of the EL(λ) spectrum of green light is increased. Therefore, as the viewing angle of the display apparatus increases, luminance decay rates of red light and blue light accelerate, and a luminance decay rate of green light is unchanged or approximately unchanged.

Figure 13:
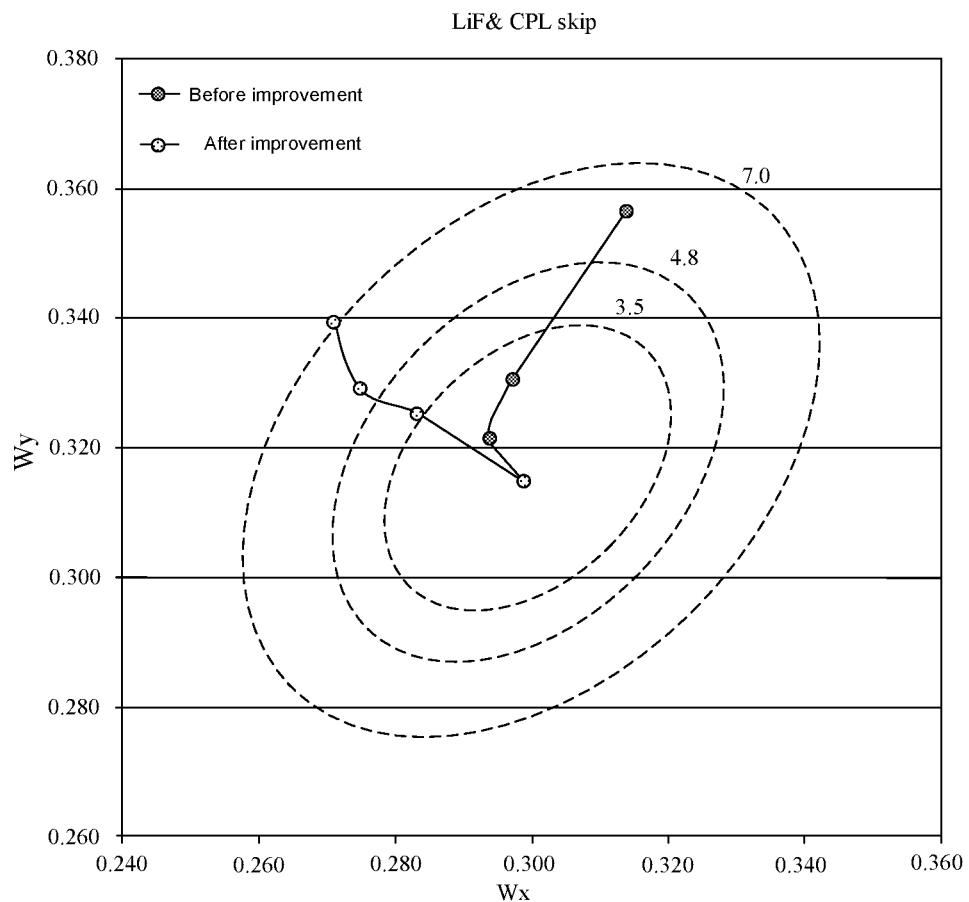
FIG. 13 is a diagram showing color shift trajectories of images displayed by display substrates before and after improvement, in accordance with some embodiments of the present disclosure.

FIG. 13 is a color shift trajectory diagram of images displayed by the display substrate. The abscissa of the color shift trajectory diagram is Wx (white light color coordinate CIEx), and the ordinate thereof is Wy (white light color coordinate CIEy). The curve "before improvement" is a color gamut curve before the protective layer and the light extraction layer 109 are omitted, and the curve "after improvement" is a color gamut curve after the protection layer and the light extraction layer 109 are omitted. It will be seen that, before the protective layer and the light extraction layer 109 in the display substrate 100 are omitted, a color shift trajectory of the curve "before improvement" is biased toward yellow as the viewing angle of the display apparatus increases (in a direction from the dotted circle 3.5 to the dotted circle 7.0); after the protective layer and the light extraction layer 109 in the display substrate 100 are omitted, a color shift trajectory of the curve "after improvement" is biased toward cyan as the viewing angle of the display apparatus increases, so that the color shift phenomenon is improved.

In addition, in some embodiments, in a case where the protective layer and the light extraction layer 109 of the display substrate 100 are omitted, the refractive index of the low-refractive-index intercalation layer 110 may be adjusted to obtain a display effect meeting the viewing requirement, so as to improve the color shift phenomenon of the display image of the display apparatus at a large viewing angle.

Figure 14:
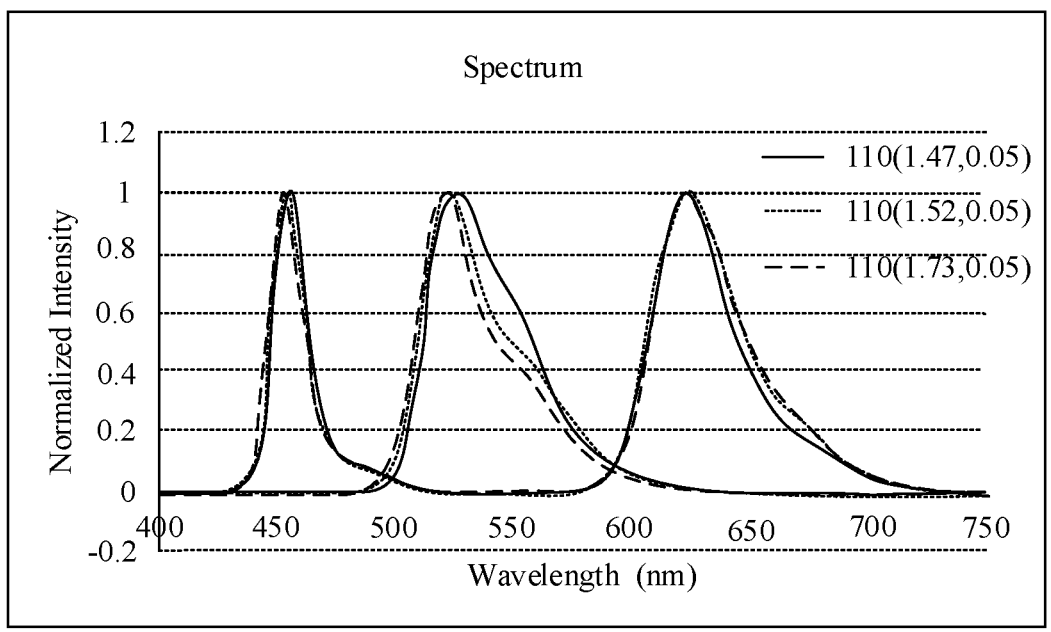
FIG. 14 is a curve graph showing spectra of light emitted by display substrates in a case where low-refractive-index intercalation layers have different refractive indexes, in accordance with some embodiments of the present disclosure.
Figure 15:
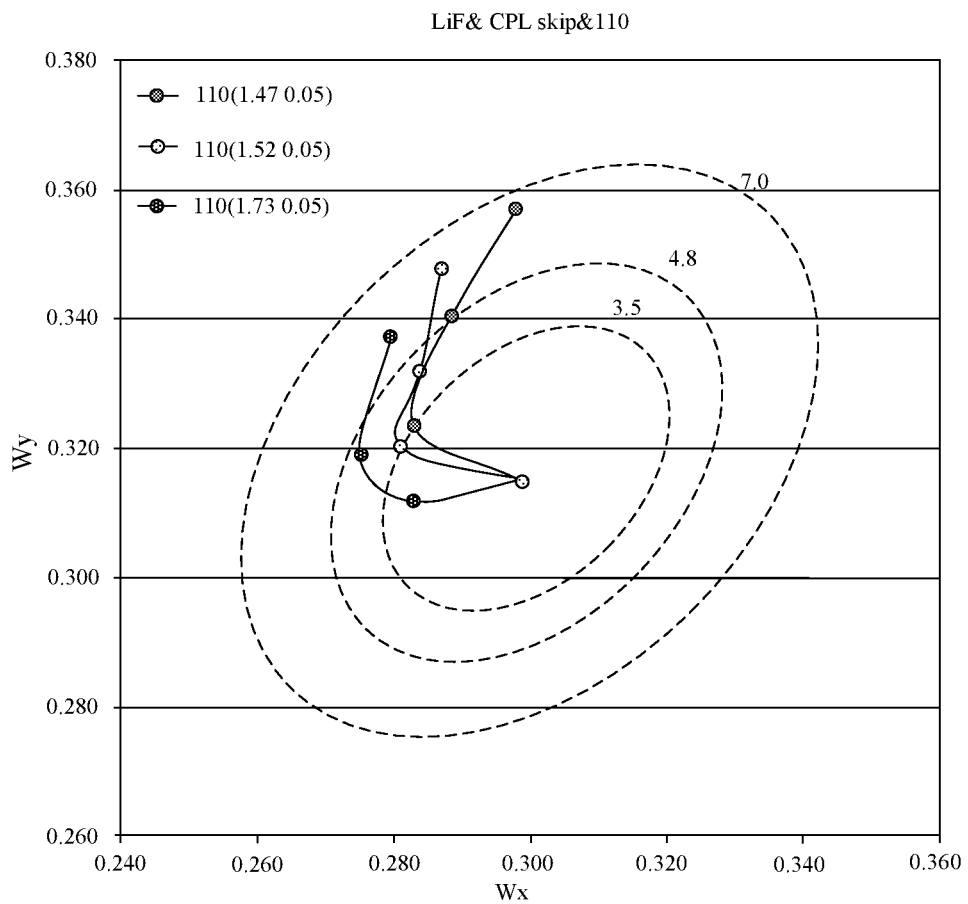
FIG. 15 is a diagram showing color shift trajectories of images displayed by display substrates in a case where low-refractive-index intercalation layers have different refractive indexes, in accordance with some embodiments of the present disclosure.

For example, FIG. 14 is a curve graph showing actually measured EL(λ) spectrum curves of red light, green light and blue light in a case where the thickness of the low-refractive-index intercalation layer 110 is 0.05 μm and the refractive index thereof is 1.47, 1.52 or 1.73. It will be seen that, in the display substrate 100 in the embodiments of the present disclosure, as the refractive index of the low-refractive-index intercalation layer 110 increases, the half-width of the EL(λ) spectrum of green light decreases, and the half-width of the EL(λ) spectrum of blue light increases. Therefore, referring to FIG. 15, as the refractive index of the low-refractive-index intercalation layer 110 and the viewing angle of the display apparatus increase, the color shift trajectory is biased toward aqua bule, so that the color shift phenomenon is improved.

In addition, in some embodiments, in the case where the protective layer and the light extraction layer 109 of the display substrate 100 are omitted, the thickness of the low-refractive-index intercalation layer 110 may also be adjusted to obtain a display effect meeting the viewing requirement, so as to improve the color shift phenomenon of the display image of the display apparatus at a large viewing angle.

Figure 16:
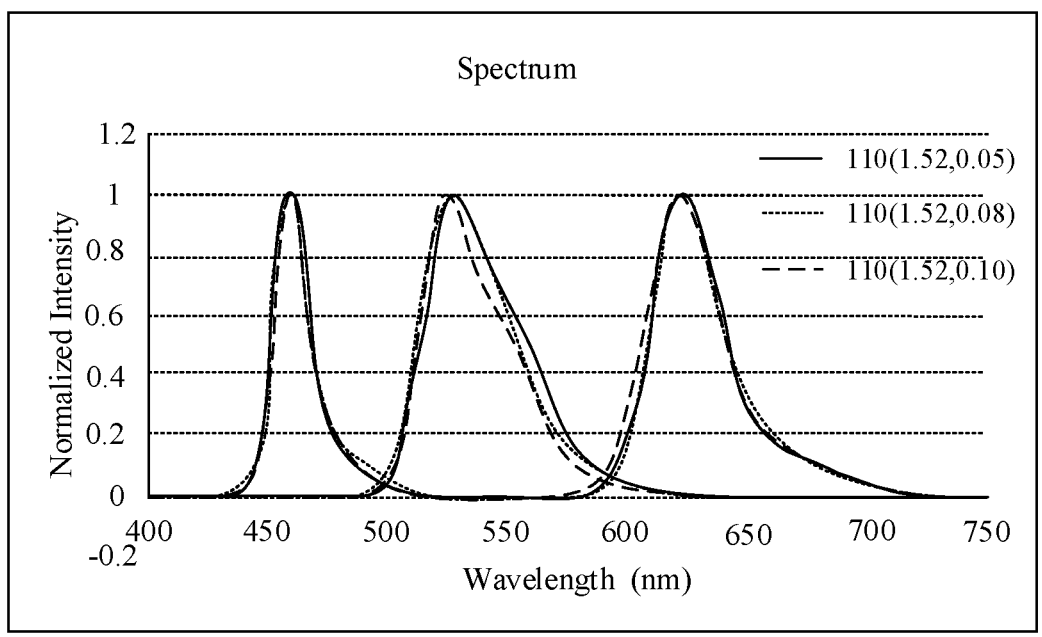
FIG. 16 is a curve graph showing spectra of light emitted by display substrates in a case where low-refractive-index intercalation layers have different thicknesses, in accordance with some embodiments of the present disclosure.
Figure 17:
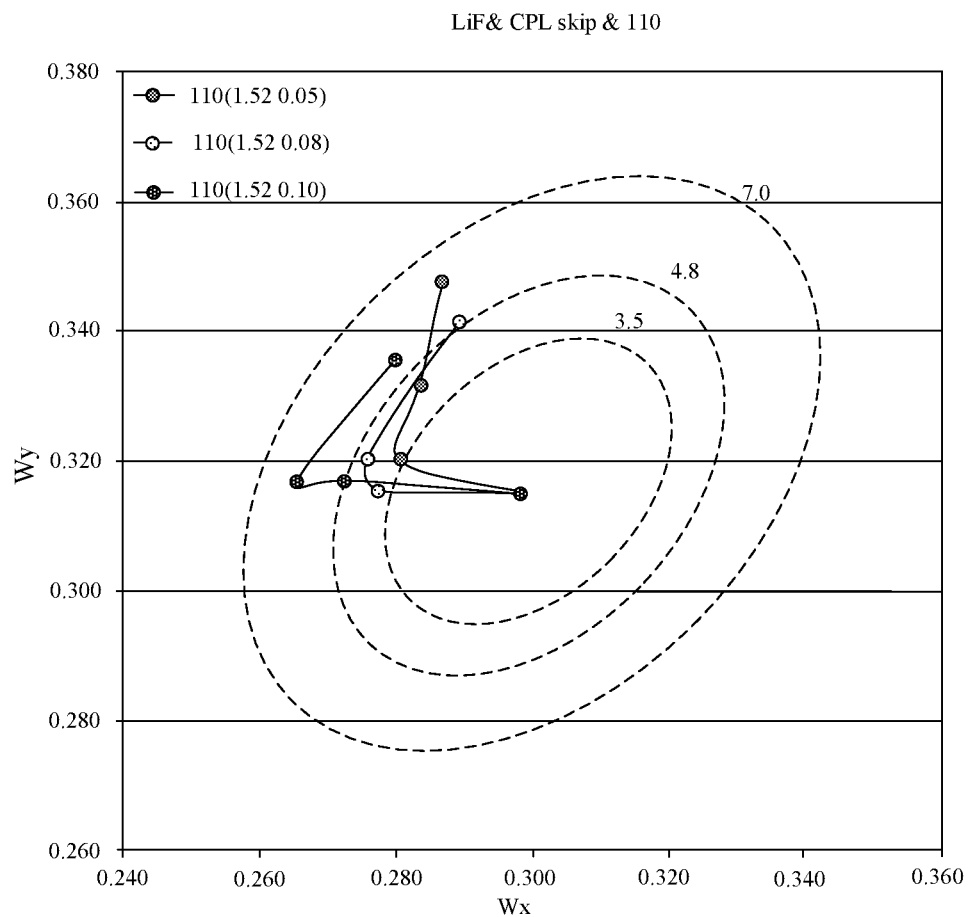
FIG. 17 is a diagram showing color shift trajectories of images displayed by display substrates in a case where low-refractive-index intercalation layers have different thicknesses, in accordance with some embodiments of the present disclosure.

For example, FIG. 16 is a curve graph showing actually measured EL(λ) spectrum curves of red light, green light and blue light in a case where the refractive index of the low-refractive-index intercalation layer 110 is 1.52 and the thickness thereof is 0.05 μm, 0.08 μm or 0.10 μm. It will be seen that, in the display substrate 100 in the embodiments of the present disclosure, as the thickness of the low-refractive-index intercalation layer 110 increases, the half width of the EL(λ) spectrum of green light decreases, and the half width of the EL(λ) spectrum of blue light increases. Therefore, referring to FIG. 17, as the thickness of the low-refractive-index intercalation layer 110 increases, in a case of a small viewing angle, a degree of color shift increases and the color shift trajectory is biased toward aqua blue; and as the thickness of the low-refractive-index intercalation layer 110 increases, in a case of a large viewing angle, the degree of color shift decreases and the color shift trajectory is biased toward cyan. Therefore, the color shift phenomenon is improved.

Some embodiments of the present disclosure provide a display apparatus 200, including the display substrate 100 in the above embodiments.

Figure 18:
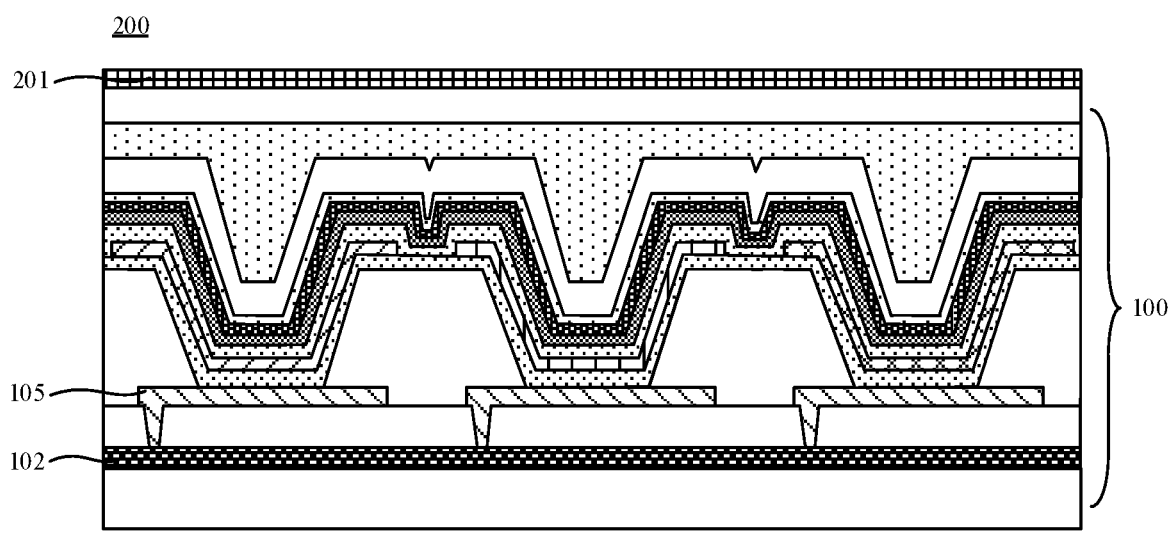
FIG. 18 is a structural diagram of a display apparatus, in accordance with some embodiments of the present disclosure.

As shown in FIG. 18, the display apparatus 200 may be an electroluminescent display apparatus, which includes the display substrate 100 and may further include a polarizer 201 adhered to the display substrate 100. The use of the polarizer 201 may reduce reflection of natural light by reflective structures (e.g., the anode layer 105, thin film transistors and metal signal lines in the pixel driving circuit layer 102, etc.) in the display substrate 100, thereby preventing the reflection of natural light from interfering with the display effect of the display apparatus 200.

In the display apparatus 200 of embodiments of the present disclosure, the low-refractive-index intercalation layer 110 and the first inorganic barrier layer 111 are provided on a side, away from the backplane 10, of the first light-emitting devices D1, the second light-emitting devices D2 and the third light-emitting devices D3, and the refractive index of the low-refractive-index intercalation layer 110 is less than the refractive index of the first inorganic barrier layer 111. As the viewing angle of the display apparatus increases, an amount of the second color light and the third color light transmitted through the low-refractive-index intercalation layer 110 is less than an amount of the first color light transmitted through the low-refractive-index intercalation layer 110, and luminance decay rates of the second color light and the third color light are greater than a luminance decay rate of the first color light. Therefore, a color of the display image of the display apparatus is biased toward a color (e.g., blue or green) of the first color light. According to the above principle, the color of the first color light may be adjusted to obtain a display effect meeting the viewing requirement, so as to improve the color shift phenomenon of the display image of the display apparatus at a large viewing angle.

The display apparatus 200 may be any device that displays images whether in motion (e.g., a video) or stationary (e.g., a static image), and whether textual or graphical. More specifically, it is anticipated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat-panel displays, computer monitors, automobile displays (e.g., odometer displays), navigators, cockpit controllers and/or displays, camera view displays (e.g., rear view camera displays in vehicles), electronic photos, electronic billboards or signages, projectors, building structures, and packaging and aesthetic structures (e.g., a display for an image of a piece of jewelry).

Figure 19A:
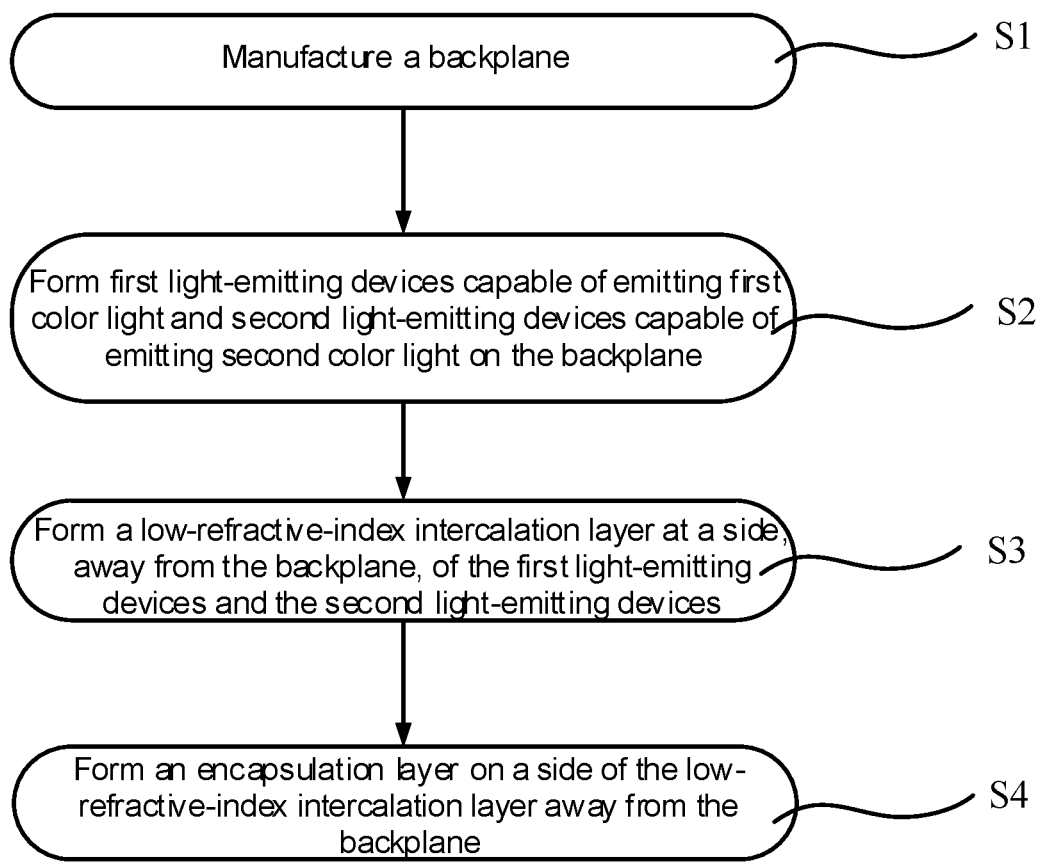
FIG. 19A is a flowchart of a manufacturing method of a display substrate, in accordance with some embodiments of the present disclosure.

Some embodiments of the present disclosure provide a manufacturing method of a display substrate, and as shown in FIG. 19A, the manufacturing method includes S1 to S4.

In S1, a backplane 10 is manufactured.

Figure 20:
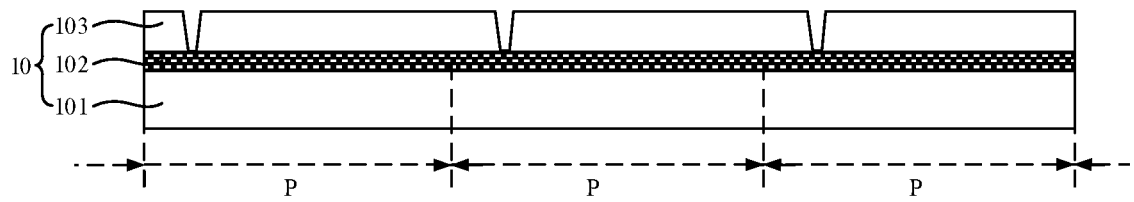
FIG. 20 to FIG. 28 are diagrams showing steps of a manufacturing method of a display substrate, in accordance with some embodiments of the present disclosure.

For example, as shown in FIG. 20, a pixel driving circuit layer 102 and a planarization layer 103 covering the pixel driving circuit layer 102 are sequentially stacked on a base 101. A plurality of via holes are formed in the planarization layer 103 by using a single patterning process.

Figure 19B:
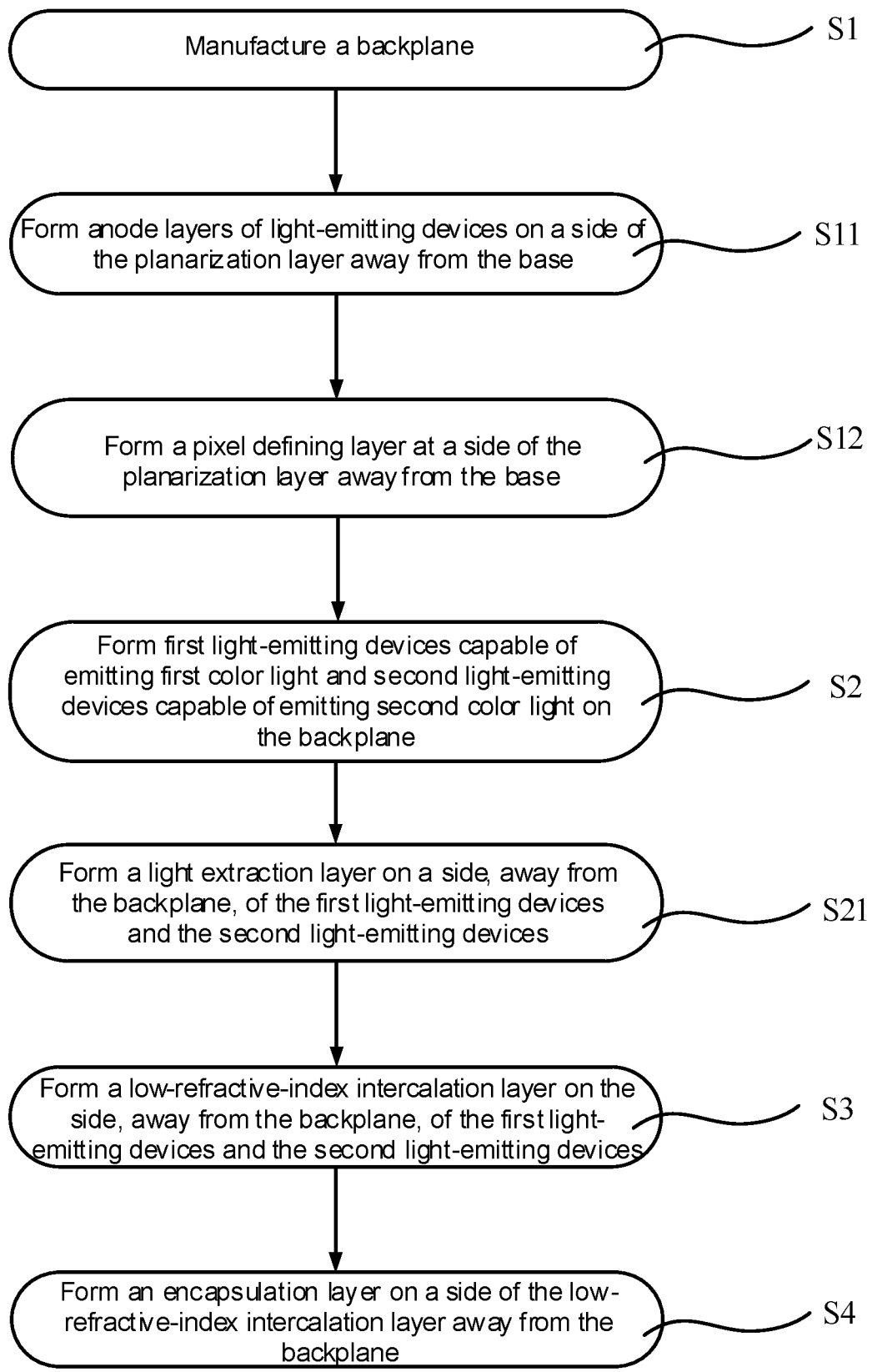
FIG. 19B is a flowchart of another manufacturing method of a display substrate, in accordance with some embodiments of the present disclosure.

In some embodiments, as shown in FIG. 19B, the manufacturing method of the display substrate further includes S11 and S12 after S1 and before S2.

Figure 21:
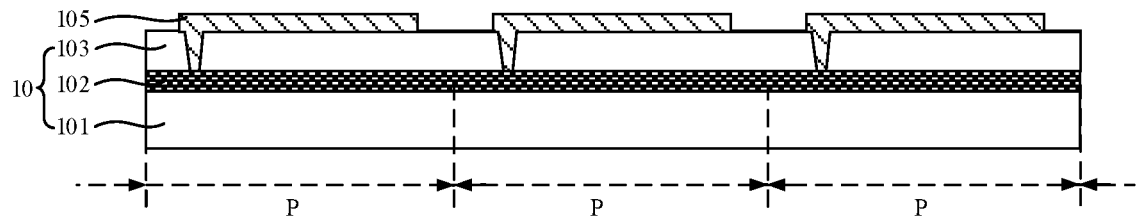

In S11, as shown in FIG. 21, anode layers 105 of light-emitting devices D are formed on a side of the planarization layer 103 away from the base 101. The anode layers 105 are electrically connected to the pixel driving circuit layer 102 through the via holes in the planarization layer 103.

Figure 22:
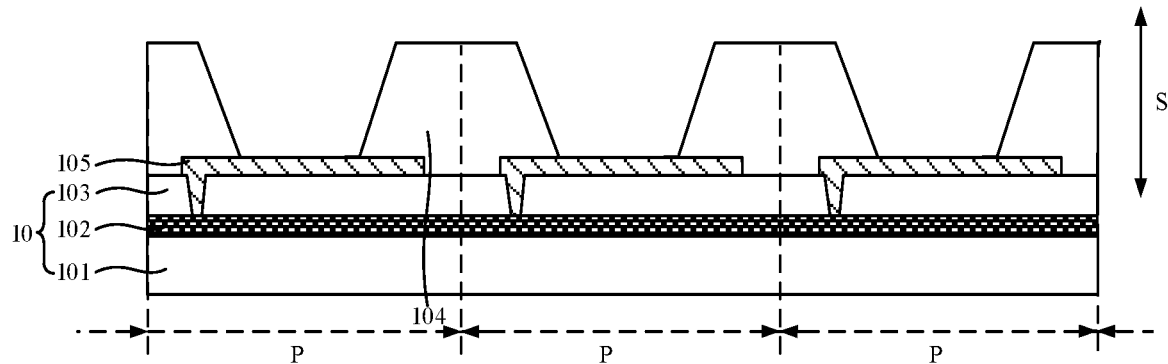

In S12, as shown in FIG. 22, a pixel defining layer 104 is formed at a side of the planarization layer 103 away from the base 101. The pixel defining layer 104 has a plurality of openings, and each sub-pixel area P corresponds to an opening of the pixel defining layer 104. In addition, the openings of the pixel defining layer 104 each expose at least a portion of an anode layer 105 of a light-emitting device D.

In S2, first light-emitting devices D1 capable of emitting first color light and second light-emitting devices D2 capable of emitting second color light are formed on the backplane 10.

Figure 23:
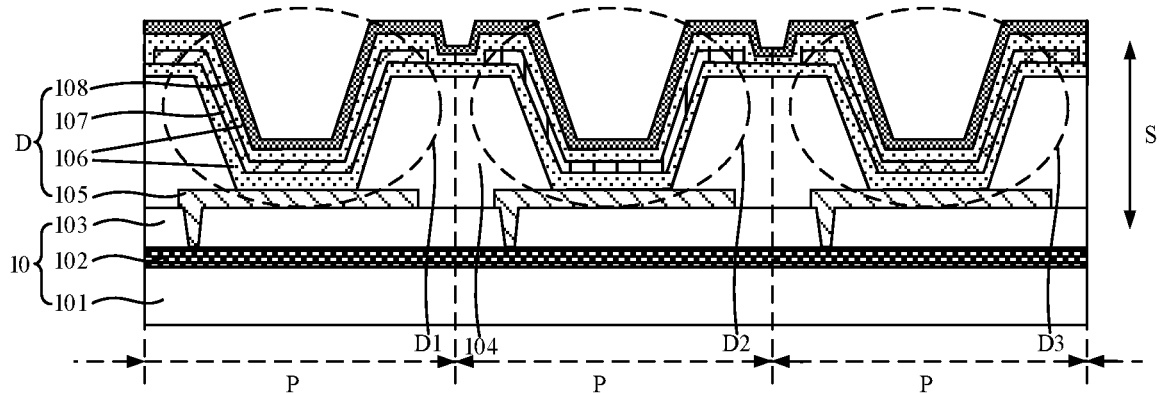

For example, as shown in FIG. 23, a common layer 106, light-emitting layers 107, another common layer 106 and a cathode layer 108 are sequentially formed on the backplane 10. A light-emitting layer 107 is disposed at a side of an anode layer 105 away from the base 101, and at least a portion of the light-emitting layer 107 is located in an opening of the pixel defining layer 104. The common layer 106 and the another common layer 106 are located on a side of the light-emitting layer 107 proximate to the anode layer 105 and on a side of the light-emitting layer 107 proximate to the cathode layer 108, respectively.

The light-emitting device D includes the anode layer 105, the common layers 106, the light-emitting layer 107 and the cathode layer 108, and each sub-pixel area P is provided with a light-emitting device D therein. For example, third light-emitting devices D3 capable of emitting third color light are further formed on the backplane 10. Every three adjacent sub-pixel areas P are provided with a first light-emitting device D1, a second light-emitting device D2, and a third light-emitting device D3 therein.

In some embodiments, as shown in FIG. 19B, after S2 and before S3, the manufacturing method of the display substrate further includes S21.

Figure 24:
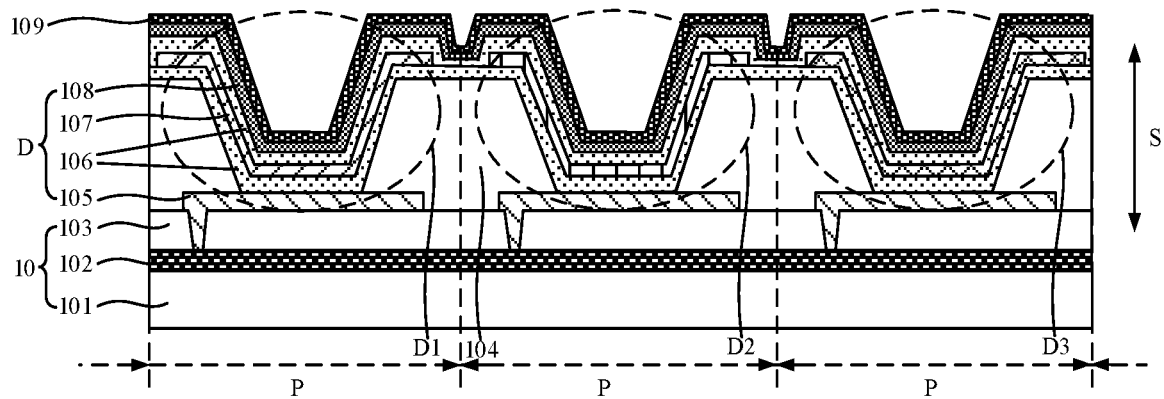

In S21, as shown in FIG. 24, a light extraction layer 109 is formed on a side, away from the backplane 10, of the first light-emitting devices D1 and the second light-emitting devices D2. A light-emitting efficiency of the display substrate 100 may be improved through the light extraction layer 109.

In S3, a low-refractive-index intercalation layer 110 is formed at the side, away from the backplane 10, of the first light-emitting devices D1 and the second light-emitting devices D2. In a direction S perpendicular to the backplane 10, a transmittance of the low-refractive-index intercalation layer 110 to the first color light is less than a transmittance of the low-refractive-index intercalation layer 110 to the second color light.

Figure 25:
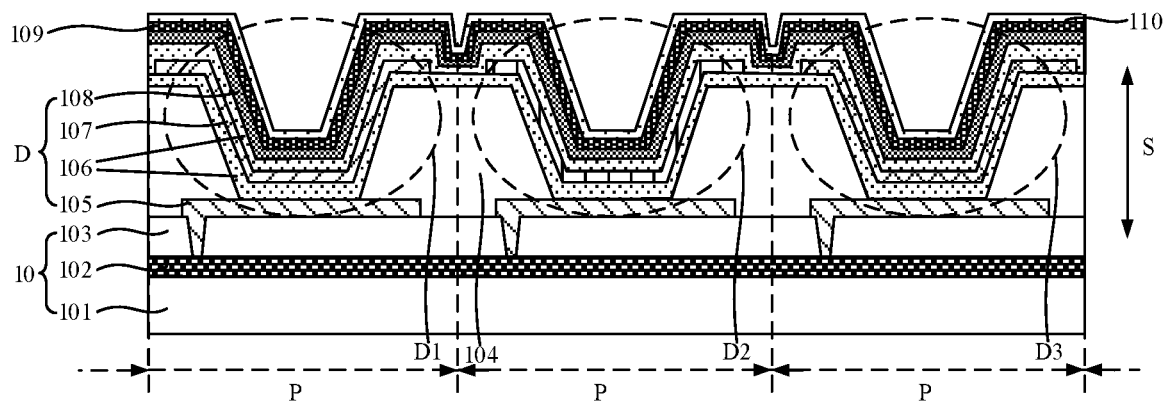

For example, as shown in FIG. 25, the low-refractive-index intercalation layer 110 is formed on a side of the light extraction layer 109 away from the backplane 10 by using a first film deposition process. For example, the first film deposition process may be a plasma enhanced chemical vapor deposition (PECVD) process.

In S4, an encapsulation layer 11 is formed on a side of the low-refractive-index intercalation layer 110 away from the backplane 10. The encapsulation layer 11 includes a first inorganic barrier layer 111, a first organic barrier layer 112 and a second inorganic barrier layer 113 that are sequentially stacked on the side of the low-refractive-index intercalation layer 110 away from the backplane 10.

Figure 26:
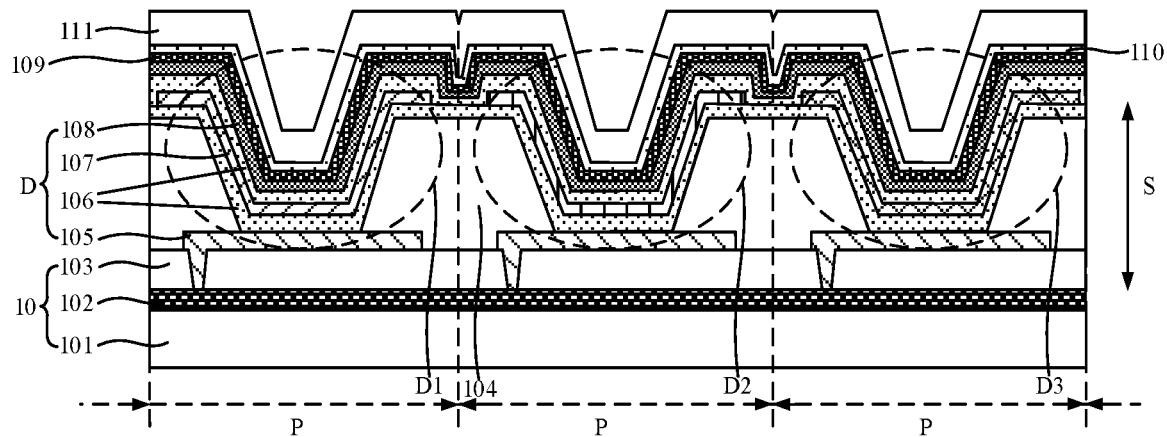

For example, as shown in FIG. 26, the first inorganic barrier layer 111 is formed on the side of the low-refractive-index intercalation layer 110 away from the backplane 10 by using a second film deposition process. A refractive index of the low-refractive-index intercalation layer 110 is less than a refractive index of the first inorganic barrier layer 111. For example, the second film deposition process may be a PECVD process.

Here, during a PECVD process, a reaction gas needs to be introduced into a reaction chamber, and electrodes in the reaction chamber ionize the reaction gas to form plasma. A ratio of a power of electrodes used in the second film deposition process to a power of electrodes used in the first film deposition process is in a range from 1.1 to 1.15, inclusive, such as 1.1, 1.12, 1.125, 1.14 or 1.15.

Figure 27:
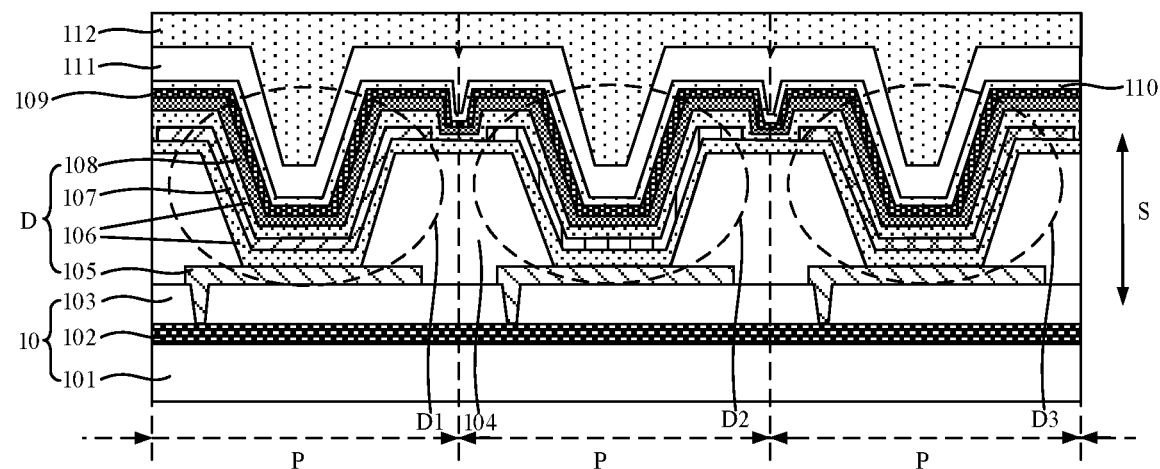

For example, as shown in FIG. 27, the first organic barrier layer 112 is formed on a side of the first inorganic barrier layer 111 away from the backplane 10 by using a PECVD process.

Figure 28:
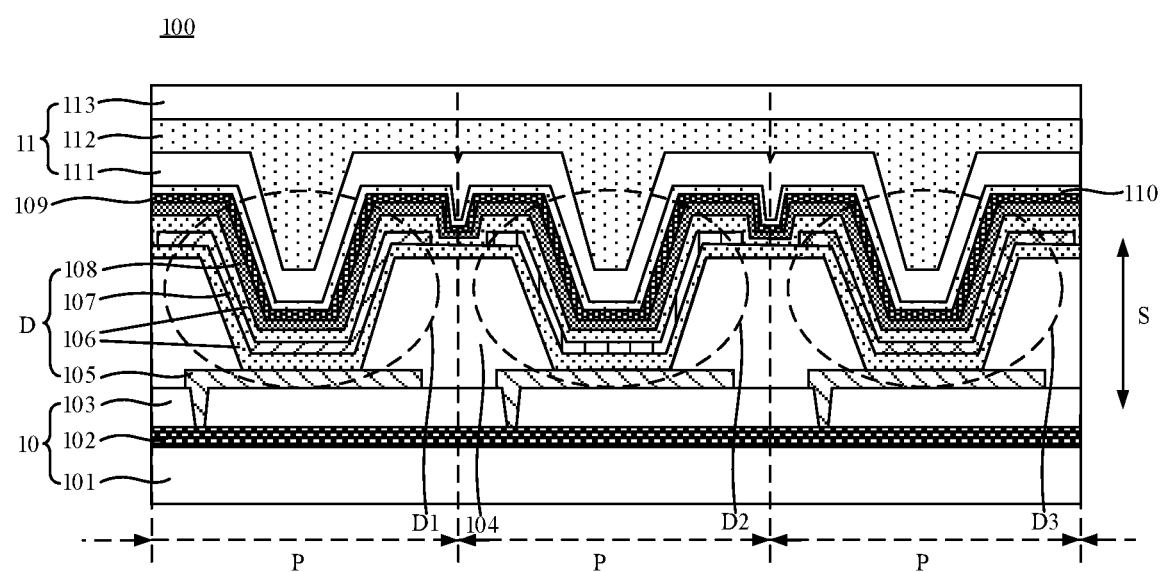

For example, as shown in FIG. 28, the second inorganic barrier layer 113 is formed on a side of the first organic barrier layer 112 away from the backplane 10 by using a PECVD process.

In the above manufacturing method of embodiments of the present disclosure, the low-refractive-index intercalation layer 110 is formed on the side of the light extraction layer 109 away from the backplane 10 by using the first film deposition process, and the first inorganic barrier layer 111 is formed on the side of the low-refractive-index intercalation layer 110 away from the backplane 10 by using the second film deposition process, and the power of the electrodes used in the first film deposition process is less than the power of the electrodes used in the second film deposition process, which may reduce or avoid an influence on optical performance of the light extraction layer 109 during a process of manufacturing the low-refractive-index intercalation layer 110.

Figure 29:
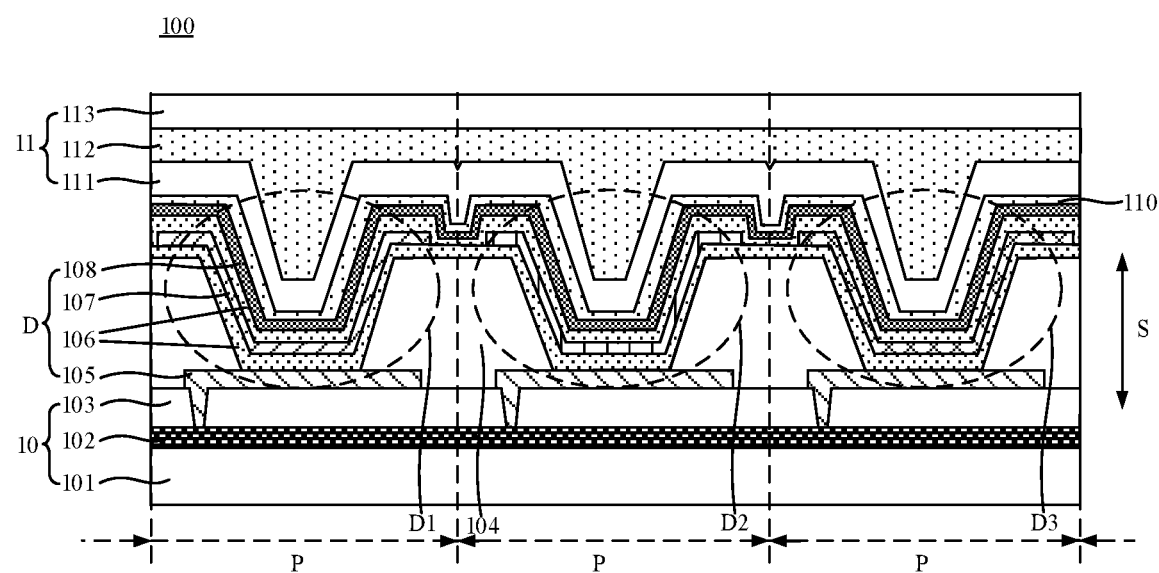
FIG. 29 is a structural diagram of another display substrate, in accordance with some embodiments of the present disclosure.

Some embodiments of the present disclosure provide another manufacturing method of a display substrate. As shown in FIG. 29, compared with S1 to S4 in the above manufacturing method of the display substrate, the manufacturing method of the display substrate in the present disclosure does not include the above S21 of forming the light extraction layer 109 on the side, away from the backplane 10, of the first light-emitting devices D1 and the second light-emitting devices D2. Instead, the low-refractive-index intercalation layer 110 is directly formed on the side, away from the backplane 10, of the first light-emitting devices D1 and the second light-emitting devices D2, so that the low-refractive-index intercalation layer 110 is in direct contact with the cathode layer 108, which may save the materials required for manufacturing the display substrate 100, and improve the color shift phenomenon of the display image of the display apparatus at a large viewing angle.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
    a backplane;
    first light-emitting devices capable of emitting first color light and second light-emitting devices capable of emitting second color light that are disposed on the backplane;
    a low-refractive-index intercalation layer disposed at a side, away from the backplane, of the first light-emitting devices and the second light-emitting devices; and
    an encapsulation layer including a first inorganic barrier layer, a first organic barrier layer and a second inorganic barrier layer that are sequentially stacked on a side of the low-refractive-index intercalation layer away from the backplane;
    wherein a refractive index of the low-refractive-index intercalation layer is less than a refractive index of the first inorganic barrier layer; and in a direction perpendicular to the backplane, a transmittance of the low-refractive-index intercalation layer to the first color light is less than a transmittance of the low-refractive-index intercalation layer to the second color light.

2. The display substrate according to claim 1, further comprising:
    third light-emitting devices capable of emitting third color light disposed on the backplane, in the direction perpendicular to the backplane, the transmittance of the low-refractive-index intercalation layer to the first color light being less than a transmittance of the low-refractive-index intercalation layer to the third color light.

3. The display substrate according to claim 1, wherein the refractive index of the low-refractive-index intercalation layer is in a range from 1.45 to 1.73, inclusive; and a thickness of the low-refractive-index intercalation layer is in a range from 0.03 µm to 0.10 µm, inclusive.

4. The display substrate according to claim 1, wherein a material of the low-refractive-index intercalation layer includes silicon oxide and silicon oxynitride, a ratio of the silicon oxide to the silicon oxynitride is in a range from 0.001 to 0.1, inclusive.

5. The display substrate according to claim 1, wherein a sum of a thickness of the first inorganic barrier layer and a thickness of the low-refractive-index intercalation layer is less than or equal to 1.1 µm.

6. The display substrate according to claim 1, wherein a thickness of the low-refractive-index intercalation layer is less than a thickness of the first inorganic barrier layer.

7. The display substrate according to claim 6, wherein the thickness of the low-refractive-index intercalation layer is in a range from 0.03 µm to 0.10 µm, inclusive; and the thickness of the first inorganic barrier layer is in a range from 1.0 µm to 1.07 µm, inclusive.

8. The display substrate according to claim 1, further comprising:
    a light extraction layer disposed at the side, away from the backplane, of the first light-emitting devices and the second light-emitting devices, and the light extraction layer being located on a side of the low-refractive-index intercalation layer proximate to the backplane, wherein
    a refractive index of the light extraction layer is greater than the refractive index of the low-refractive-index intercalation layer.

9. The display substrate according to claim 8, wherein the refractive index of the low-refractive-index intercalation layer is in a range from 1.45 to 1.63, inclusive; and the refractive index of the light extraction layer is in a range from 1.8 to 2.0, inclusive.

10. The display substrate according to claim 1, wherein the display substrate has a plurality of sub-pixel areas; each sub-pixel area is provided with a light-emitting device of the first light-emitting devices and the second light-emitting devices therein, and the light-emitting device includes a cathode layer; and
    the low-refractive-index intercalation layer is in direct contact with the cathode layer.

11. The display substrate according to claim 10, wherein the refractive index of the low-refractive-index intercalation layer is in a range from 1.47 to 1.73, inclusive; and a thickness of the low-refractive-index intercalation layer is in a range from 0.05 µm to 0.10 µm, inclusive.

12. The display substrate according to claim 1, wherein the encapsulation layer further includes a second organic barrier layer and a third inorganic barrier layer that are sequentially stacked on a side of the second inorganic barrier layer away from the backplane.

13. The display substrate according to claim 1, wherein the refractive index of the first inorganic barrier layer is in a range from 1.75 to 1.85, inclusive.

14. A display apparatus, comprising the display substrate according to claim 1.

15. A manufacturing method of a display substrate, the manufacturing method comprising:
    manufacturing a backplane;
    forming first light-emitting devices capable of emitting first color light and second light-emitting devices capable of emitting second color light on the backplane;
    forming a low-refractive-index intercalation layer at a side, away from the backplane, of the first light-emitting devices and the second light-emitting devices; and
    forming an encapsulation layer on a side of the low-refractive-index intercalation layer away from the backplane, the encapsulation layer including a first inorganic barrier layer, a first organic barrier layer and a second inorganic barrier layer that are sequentially stacked on a side of the low-refractive-index intercalation layer away from the backplane;
    wherein a refractive index of the low-refractive-index intercalation layer is less than a refractive index of the first inorganic barrier layer; and in a direction perpendicular to the backplane, a transmittance of the low-refractive-index intercalation layer to the first color light is less than a transmittance of the low-refractive-index intercalation layer to the second color light.

16. The manufacturing method according to claim 15, wherein the low-refractive-index intercalation layer is formed at the side, away from the backplane, of the first light-emitting devices and the second light-emitting devices by using a first film deposition process; and the first inorganic barrier layer is formed on the side of the low-refractive-index intercalation layer away from the backplane by using a second film deposition process.

17. The manufacturing method according to claim 16, further comprising:

forming a light extraction layer at the side, away from the backplane, of the first light-emitting devices and the second light-emitting devices before forming the low-refractive-index intercalation layer.

18. The manufacturing method according to claim 17, wherein a ratio of a power of electrodes used in the second film deposition process to a power of electrodes used in the first film deposition process is in a range from 1.1 to 1.15, inclusive.

19. The display substrate according to claim 2, wherein the first color light is blue light, the second color light is one of red light and green light, and the third color light is another of red light and green light.

20. The display substrate according to claim 2, wherein the first color light is green light, the second color light is one of red light and blue light, and the third color light is another of red light and blue light.

* * * * *